(12) United States Patent
Lin et al.

(10) Patent No.: US 9,966,448 B2
(45) Date of Patent: May 8, 2018

(54) METHOD OF MAKING A SILICIDE BENEATH A VERTICAL STRUCTURE

(71) Applicant: Taiwan Semiconductor Manufacturing Company Limited, Hsinchu (TW)

(72) Inventors: Cheng-Tung Lin, Hsinchu County (TW); Teng-Chun Tsai, Hsinchu (TW); Li-Ting Wang, Hsinchu (TW); De-Fang Chen, Hsinchu (TW); Huang-Yi Huang, Hsin-chu (TW); Hui-Cheng Chang, Tainan (TW); Huan-Just Lin, Hsinchu (TW); Ming-Hsing Tsai, HsinChu County (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days. days.

(21) Appl. No.: 14/279,413

(22) Filed: May 16, 2014

(65) Prior Publication Data

US 2015/0333152 A1 Nov. 19, 2015

(51) Int. Cl.
| | |
|---|---|
| H01L 21/00 | (2006.01) |
| H01L 29/423 | (2006.01) |
| H01L 29/66 | (2006.01) |
| H01L 29/78 | (2006.01) |
| H01L 21/285 | (2006.01) |
| H01L 29/10 | (2006.01) |

(Continued)

(52) U.S. Cl.
CPC .. H01L 29/42376 (2013.01); H01L 21/28512 (2013.01); H01L 21/28518 (2013.01); H01L 21/76224 (2013.01); H01L 29/1037 (2013.01); H01L 29/42392 (2013.01); H01L 29/66666 (2013.01); H01L 29/7827 (2013.01); *H01L 29/0676* (2013.01); *H01L 29/66439* (2013.01); *H01L 29/775* (2013.01)

(58) Field of Classification Search
CPC ........... H01L 29/7926; H01L 29/66666; H01L 29/7827; H01L 29/78642; H01L 21/823885; H01L 29/42376
See application file for complete search history.

(56) References Cited

U.S. PATENT DOCUMENTS

| | | | |
|---|---|---|---|
| 6,376,372 B1 * | 4/2002 | Paranjpe | ........... H01L 21/28518 257/E21.165 |
| 6,531,396 B1 * | 3/2003 | Chi | ................... H01L 21/28518 257/E21.438 |

(Continued)

FOREIGN PATENT DOCUMENTS

EP 2246895 A1 * 11/2010 ..... H01L 21/823814

*Primary Examiner* — Thao X Le
*Assistant Examiner* — Laura Dykes
(74) *Attorney, Agent, or Firm* — Jones Day

(57) ABSTRACT

According to an exemplary embodiment, a method of forming a vertical structure is provided. The method includes the following operations: providing a substrate; providing the vertical structure with a source and a channel over the substrate; forming a spacer over the vertical structure; etching a portion of the spacer to expose the source; forming a first metal layer over the vertical structure; and thermal annealing the first metal layer to form a bottom silicide penetrating the source; and substantially removing the spacer.

20 Claims, 35 Drawing Sheets

(51) Int. Cl.
*H01L 21/762* (2006.01)
*H01L 29/775* (2006.01)
*H01L 29/06* (2006.01)

(56) References Cited

U.S. PATENT DOCUMENTS

| | | | |
|---|---|---|---|
| 2009/0104746 A1* | 4/2009 | Clifton | H01L 29/0673 438/299 |
| 2010/0207172 A1* | 8/2010 | Masuoka | H01L 21/82380 257/255 |
| 2011/0062411 A1* | 3/2011 | Bangsaruntip | B82Y 10/00 257/9 |
| 2011/0068418 A1* | 3/2011 | Lung | B82Y 10/00 257/413 |
| 2012/0299088 A1* | 11/2012 | Heineck | H01L 27/10802 257/329 |

* cited by examiner

100

2300

3400

METHOD OF MAKING A SILICIDE BENEATH A VERTICAL STRUCTURE

BACKGROUND

Vertical semiconductor devices, such as vertical gate-all-around transistors, are an emerging research area in the semiconductor industry. However, in vertical devices, the contact resistance of a source/drain parasitic resistance degrades device performance, especially in high-speed applications. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
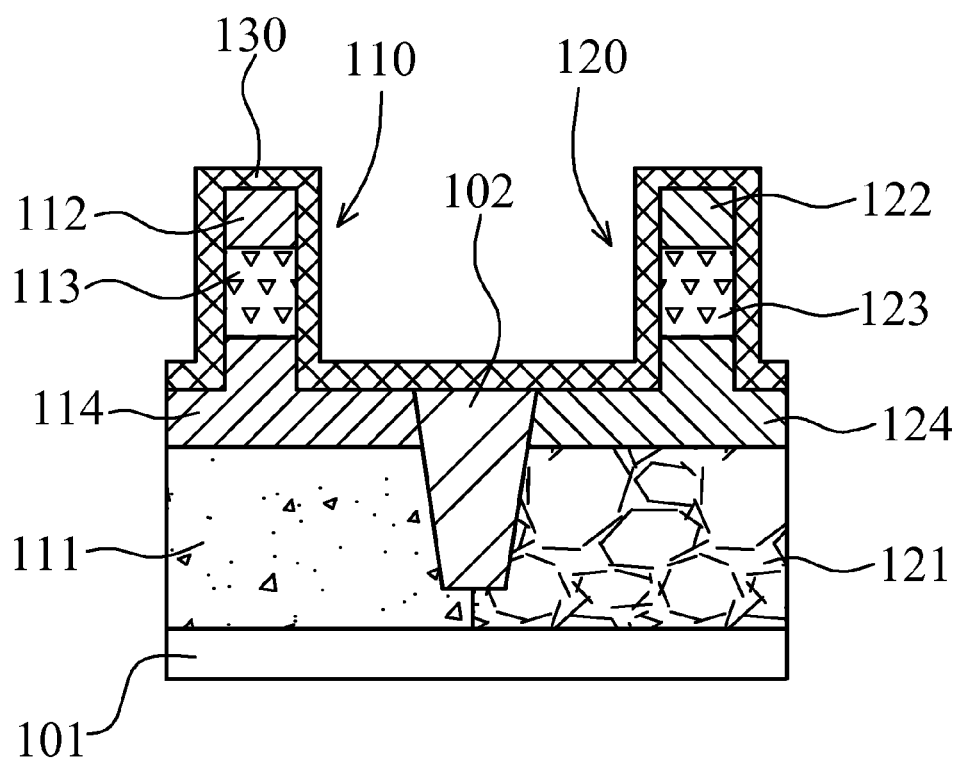
FIG. 1 is a sectional view illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a vertical structure and a method of forming a vertical structure. The disclosure may provide a vertical structure having a large silicide area for both the source and the drain (S/D) and may further provide a vertical structure having a symmetric silicide area for the S/D. The disclosure may also provide methods of forming the vertical structures having large silicide area and symmetric silicide area for the S/D. Therefore, the disclosure may reduce the contact resistance of the S/D parasitic resistance to enhance device performance because the contact resistance is inversely proportional to the contact area between the S/D and the silicides. The disclosure is applicable at least to Si/SiGe/Ge/III-V vertical gate all around devices. Additionally, the material of the silicide for the drain may be different from that for the source. And the S/D may be formed of, for example, p-n junctions with silicides or a metal S/D.

FIG. 1 is a sectional view illustrating an exemplary semiconductor device in accordance with some embodiments. As shown in FIG. 1, a semiconductor device 100 is provided. In the semiconductor device 100, a first vertical structure 110 and a second vertical structure 120 are provided over a substrate 101. The first vertical structure 110 and the second vertical structure 120 may be vertical-gate-all-around devices electrically isolated by shallow trench isolation 102. The first vertical structure 110 may be a PMOS, and may include an n-well 111, a first source 114, a first channel 113, and a first drain 112. The second vertical structure 120 may be a NMOS, and may include a p-well 121, a second source 124, a second channel 123, and a second drain 122. The selection of the first vertical structure 110 and second vertical structure 120 as, respectively, PMOS and NMOS is an arbitrary choice made for purposes of illustration. Those skilled in the art upon reading this disclosure would appreciate that other options are available.

The first source 114 is disposed over the n-well 111. The first channel 113 is disposed over the first source 114. The first drain 112 is disposed over the first channel 113. The second source 124 is disposed over the p-well 121. The second channel 123 is disposed over the second source 124. The second drain 122 is disposed over the second channel 123. The following procedures may be performed on the first vertical structure 110 and the second vertical structure 120, so will only be discussed below with respect to the first vertical structure 110. Additionally, a spacer film 130 is formed over the first vertical structure 110 and the second vertical structure 120. The material of the spacer film 130 may be, for example, silicon nitride.

In one embodiment, the substrate 101 includes a crystalline silicon substrate. In some alternative embodiments, the substrate 101 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 101 may include an epitaxial layer (epi-layer), may be strained for performance enhancement, and/or may include a silicon-on-insulator (SOI) structure.

Figure 2:
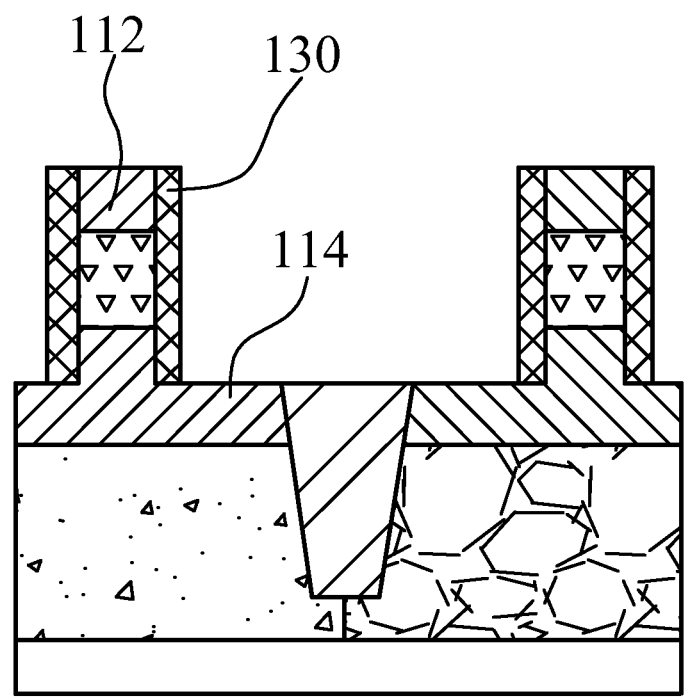
FIG. 2 is a sectional view illustrating the exemplary semiconductor device in accordance with some embodiments.

FIG. 2 is a sectional view illustrating the exemplary semiconductor device in accordance with some embodiments. As shown in FIG. 2, a portion of the spacer film 130 is etched to expose the first source 114 and the drain 112 for formation of silicides later.

Figure 3:
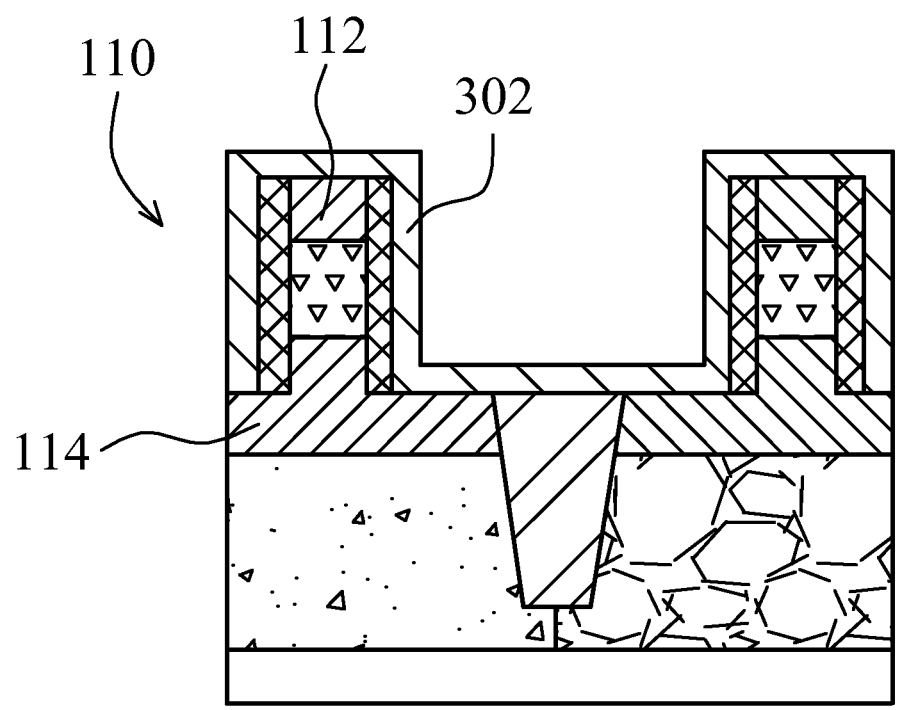
FIG. 3 is a sectional view illustrating the exemplary semiconductor device in accordance with some embodiments.

FIG. 3 is a sectional view illustrating the exemplary semiconductor device in accordance with some embodiments. As shown in FIG. 3, a first metal layer 302 for silicide formation is formed over the first vertical structure 110. The first metal layer 302 is made of, for example, nickel, titanium, cobalt, nickel platinum and combinations thereof and may be further made with a titanium nitride cap layer (not shown). The thickness of the first metal layer 302 may be about 5 angstrom to about 1000 angstrom.

Furthermore, before the formation of the first metal layer 302, a pre-amorphization implant (PAI) process is optional and may be performed on the first source 114 and the drain 112 to enhance formation of silicides in the following processes. The detailed PAI information may include: implanting with dopant of Ge, Si, Xe or other species and combination thereof, a PAI angle of 0 to 90 degree, a PAI energy of 100 eV to 100 KeV, and a PAI dosage of $10^{17}/cm^3$ to $5*10^{21}/cm^3$.

Figure 4:
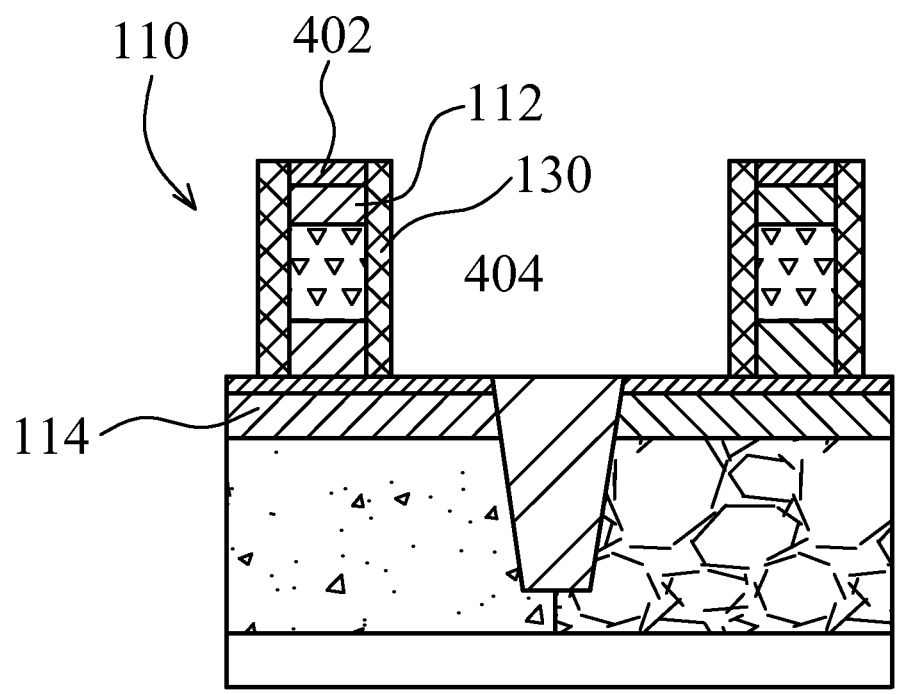
FIG. 4 is a sectional view illustrating the exemplary semiconductor device in accordance with some embodiments.

FIG. 4 is a sectional view illustrating the exemplary semiconductor device in accordance with some embodiments. As shown in FIGS. 3 and 4, thermal anneal is performed on the first metal layer 302, and unreacted portions of the first metal layer 302 is removed by a wet etching process. Accordingly, a bottom silicide 404 penetrating the first source 114 and a temporary silicide 402 contacting with the drain 112 are formed. Therefore, the disclosure may reduce the contact resistance of the first source 114, so as to enhance device performance because the contact resistance is inversely proportional to the contact area between the first source 114 and the bottom silicide 404.

The bottom silicide 404 and the temporary silicide 402 are made of titanium disilicide or nickel platinum silicide. When the bottom silicide 404 is made of titanium disilicide, the bottom silicide 404 may be two divisions without mergence and penetration of the first source 114.

The thermal anneal may be a rapid thermal anneal (RTA). When the RTA is applied, the annealing temperature is about 100° C. to about 1000° C. and in a duration of about 0.01 seconds to about 10 seconds. If the thermal anneal proceeds only several milliseconds, the annealing temperature is about 500° C. to about 1200° C. Moreover, the thickness of the bottom silicide 404 may be about 10 angstrom to 1000 angstrom.

Figure 4A:
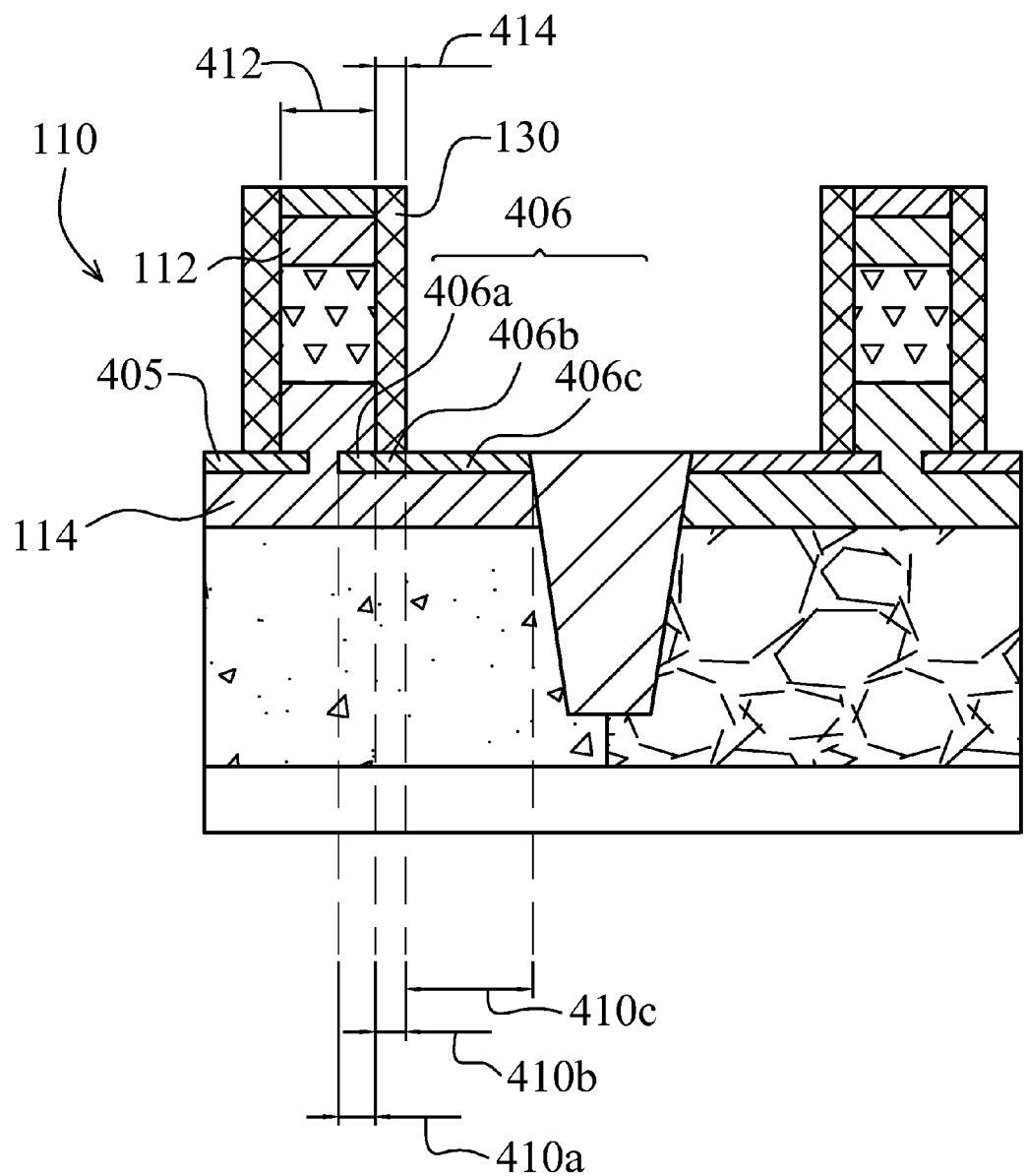
FIG. 4A is a sectional view illustrating the exemplary semiconductor device in accordance with some embodiments.

FIG. 4A is another sectional view illustrating the exemplary semiconductor device in accordance with some embodiments. As shown in FIG. 4A, the bottom silicide 404 is not merged, and it includes two divisions without mergence and penetration of the first source 114.

For example, the bottom silicide 404 includes a first division 406 and a second division 405. The first division 406 may include silicide portions 406a, 406b, 406c. The silicide portion 406a is disposed beneath the drain 112. The silicide portion 406b is beneath the spacer film 130 adjacent the vertical structure 110. The silicide portion 406c is exposed without overlapping with the spacer film 130.

Moreover, the width 410a of the silicide portion 406a may vary from zero to one-third of the diameter 412 of the vertical structure 110. The width 410b of the silicide portion 406b may vary from zero to the width 414 of the spacer 130. In some embodiment, the first division 406 does not go under the drain 112, so the first division 406 does not include the silicide portion 406a. In some embodiment, the first division 406 does not go under the drain 112 and the spacer film 130, so the first division 406 does not include the silicide portions 406a, 406b, and include the silicide portion 406a only. The following steps of forming the vertical devices hereinafter may be applied by continuing from not only FIG. 4 but also FIG. 4A.

Figure 5:
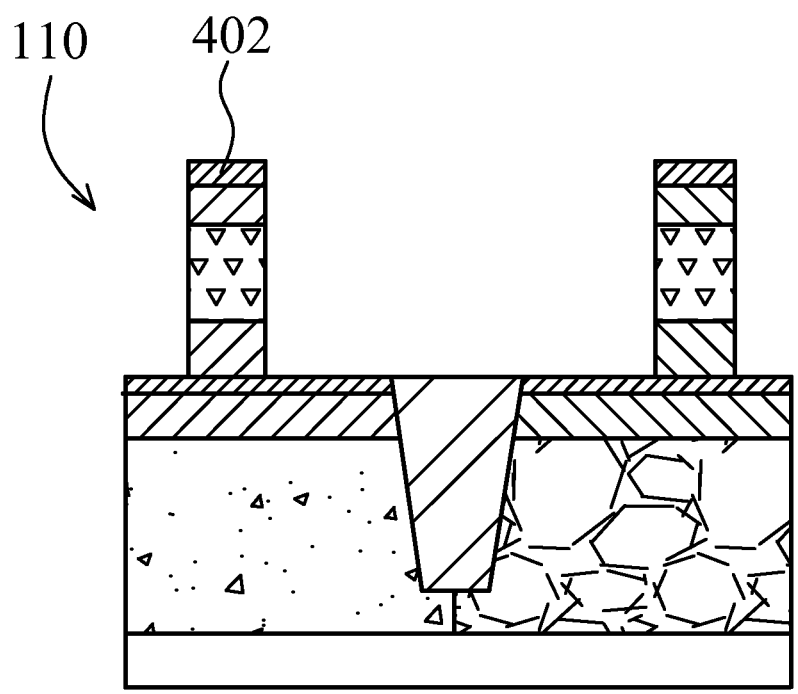
FIG. 5 is a sectional view illustrating the exemplary semiconductor device in accordance with some embodiments.

FIG. 5 is a sectional view illustrating the exemplary semiconductor device in accordance with some embodiments. As shown in FIGS. 4 and 5, the spacer film 130 is removed. In the following processes, the temporary silicide 402 will be removed and other components of the first vertical structure 110 will be introduced.

Figure 6:
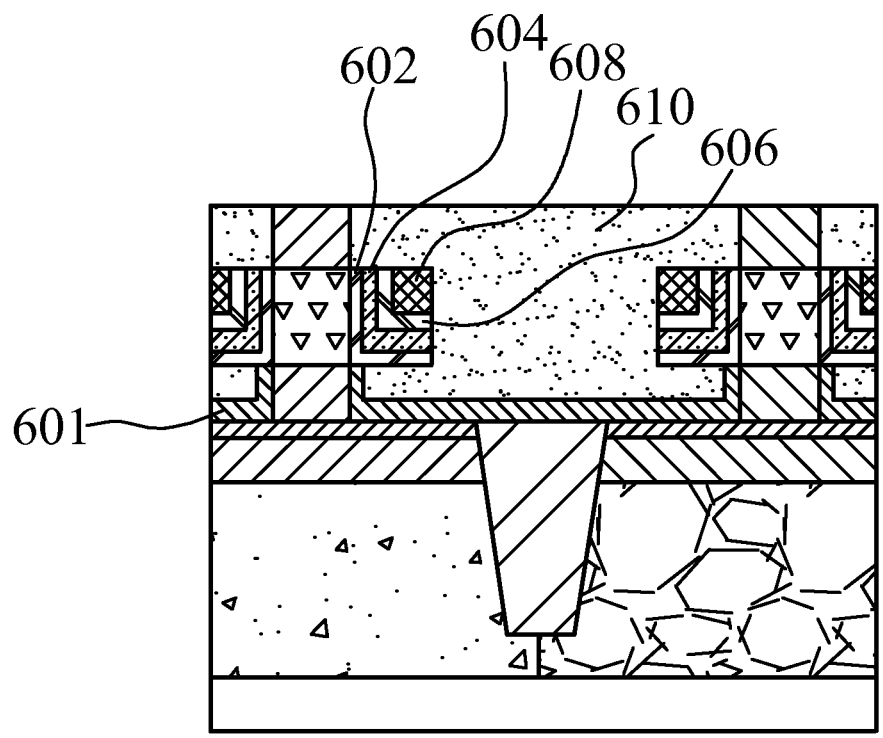
FIG. 6 is a sectional view illustrating the exemplary semiconductor device in accordance with some embodiments.

FIG. 6 is a sectional view illustrating the exemplary semiconductor device in accordance with some embodiments. As shown in FIG. 6, an etch stop layer 601, a high-k dielectric layer 602, work function metal (WFM) layers 604, 606, a metal gate 608 and an oxide layer 610 are formed in the semiconductor device 100.

Figure 7:
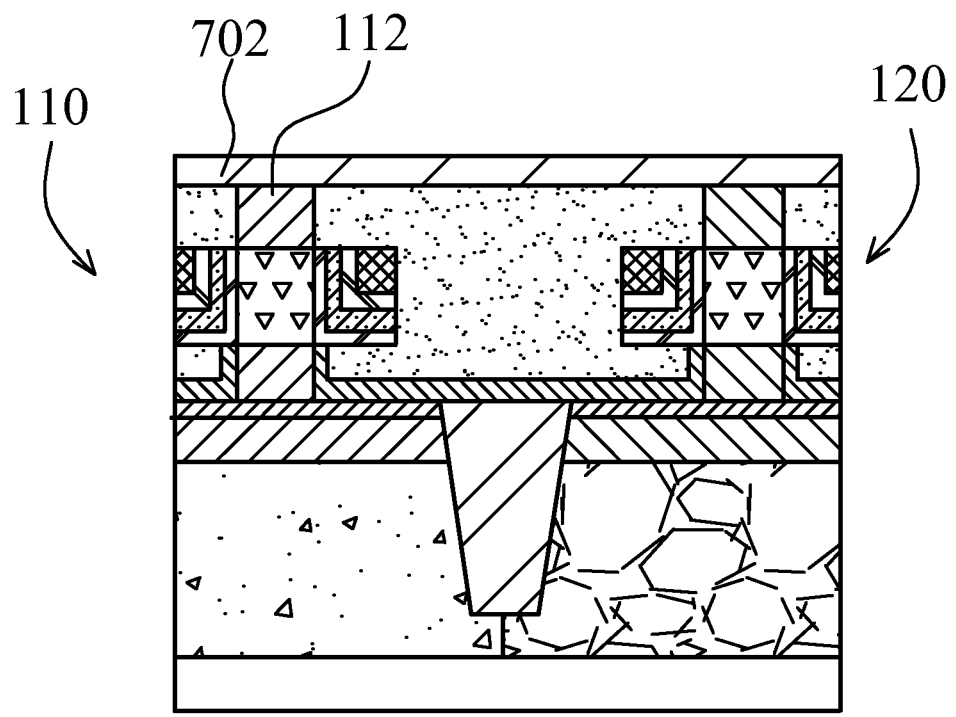
FIG. 7 is a sectional view illustrating the exemplary semiconductor device in accordance with some embodiments.

FIG. 7 is a sectional view illustrating the exemplary semiconductor device in accordance with some embodiments. As shown in FIG. 7, a semiconductor layer 702 is formed over the first drain 112. In the embodiment, the semiconductor layer 702 includes amorphous silicon. In some alternative embodiments, the semiconductor layer 702 may be made of germanium. A pre-amorphization implant (PAI) process is optional and may be performed on the semiconductor layer 702 to enhance formation of silicides in the following processes. The detailed PAI information may include: implanting with dopant of Ge, Si, Xe or other species and combination thereof, a PAI angle of 0 to 90 degree, a PAI energy of 100 eV to 100 KeV, and a PAI dosage of $10^{17}/cm^3$ to $5*10^{21}/cm^3$.

Figure 8:
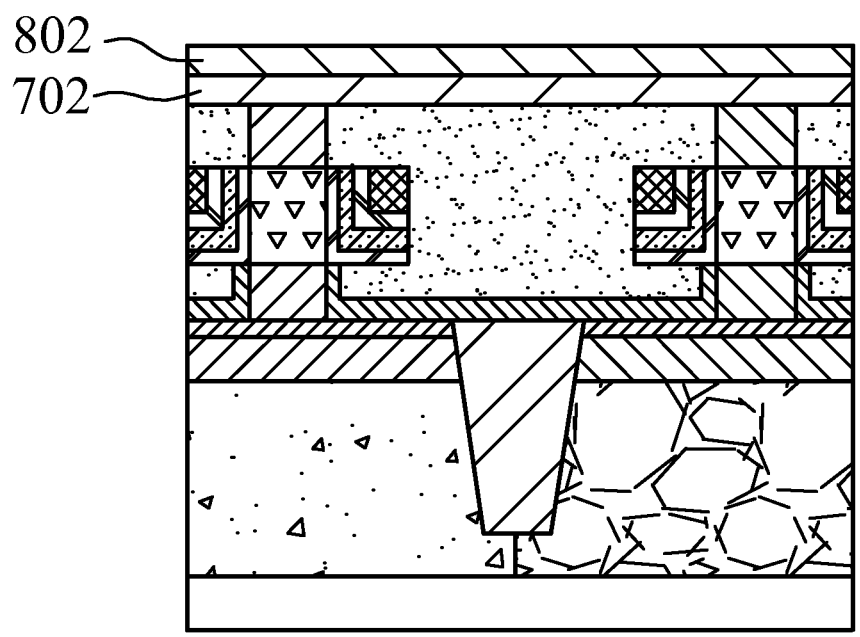
FIG. 8 is a sectional view illustrating the exemplary semiconductor device in accordance with some embodiments.

FIG. 8 is a sectional view illustrating the exemplary semiconductor device in accordance with some embodiments. As shown in FIG. 8, a second metal layer 802 for silicide formation is formed over the semiconductor layer 702. The second metal layer 802 is made of, for example, nickel, titanium, cobalt, nickel platinum and combinations thereof and may be further with a titanium nitride cap layer (not shown). The thickness of the second metal layer 802 may be about 5 angstrom to 1000 angstrom.

Figure 9:
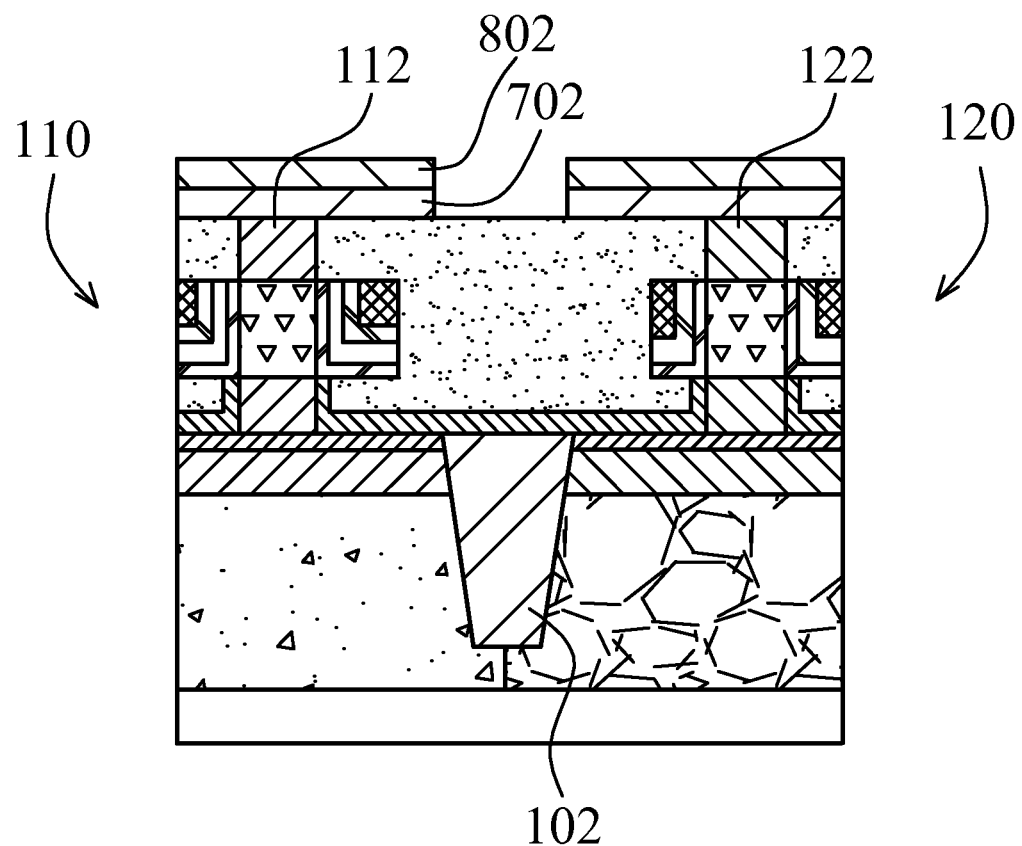
FIG. 9 is a sectional view illustrating the exemplary semiconductor device in accordance with some embodiments.

FIG. 9 is a sectional view illustrating the exemplary semiconductor device in accordance with some embodiments. As shown in FIG. 9, a portion of the semiconductor layer 702 and a portion of the second metal layer 802 over the STI 102 are removed to disconnect the first drain 112 of the first vertical structure 110 and the second drain 122 of the second vertical structure 120 by an etching process.

Figure 10:
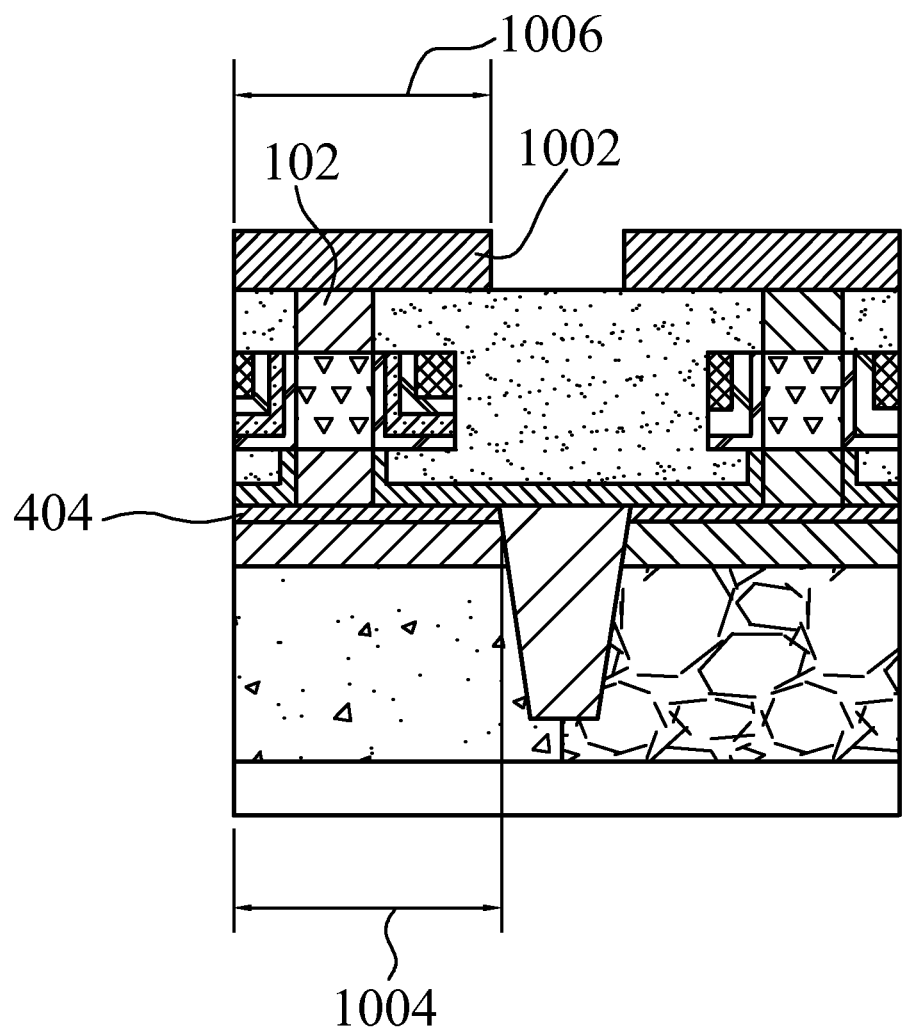
FIG. 10 is a sectional view illustrating the exemplary semiconductor device in accordance with some embodiments.

FIG. 10 is a sectional view illustrating the exemplary semiconductor device in accordance with some embodiments. As shown in FIGS. 9 and 10, thermal anneal is performed on and fully consumes the semiconductor layer 702 to form the top silicide 1002, and unreacted portions of the second metal layer 802 is removed by a wet etching process. Therefore, the top silicide 1002 is formed contacting with the first drain 112 and has a larger horizontal cross section area than the first drain 112. In some embodiment, the top silicide 1002 has the horizontal cross section area symmetrical to the bottom silicide 404. In some embodiment, the width 1006 of the top silicide 1002 is identical to the width 1004 of the bottom silicide 404. The top silicide 1002 is made of, for example, titanium disilicide or nickel platinum silicide.

Therefore, in addition to improving the contact resistance of the first source 114, the disclosure may reduce the contact resistance of the first drain 112 so as to enhance device performance.

Next, other ways are depicted to reduce the contact resistance of the S/D parasitic resistance to enhance device performance.

Figure 11:
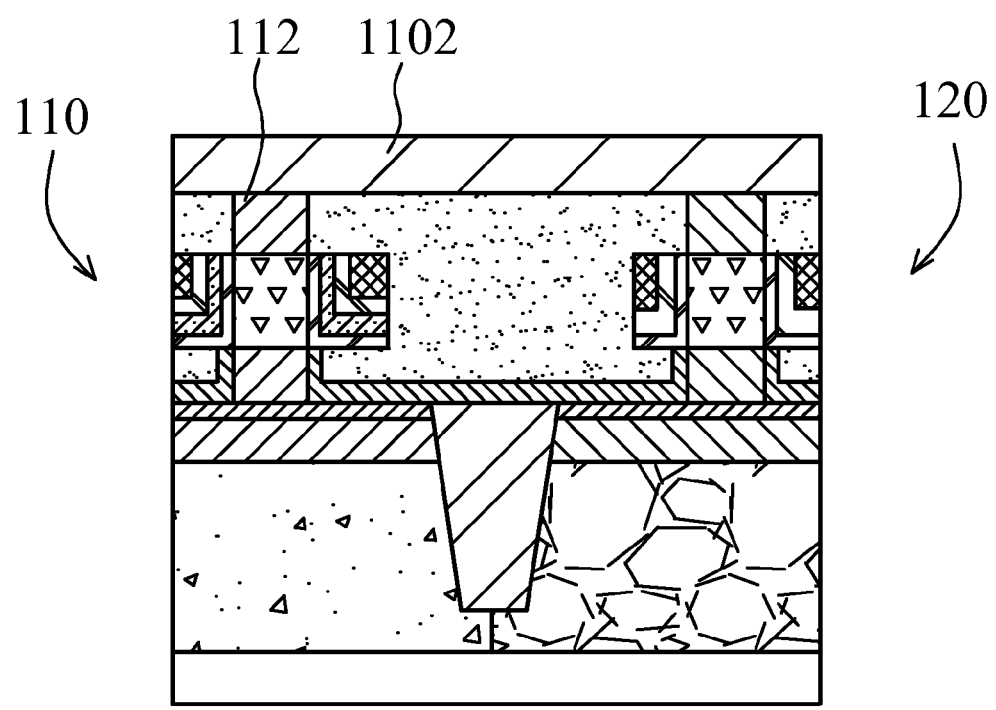
FIG. 11 is a sectional view illustrating the exemplary semiconductor device in accordance with some embodiments.

FIG. 11 is a sectional view illustrating the exemplary semiconductor device in accordance with some embodiments. Continuing from FIG. 6, as shown in FIG. 11, a semiconductor layer 1102 is formed over the first drain 112. In the embodiment, the semiconductor layer 1102 is a highly doped epitaxy layer. In some embodiment, a portion of the semiconductor layer 1102 over the first vertical structure 110 and another portion of the semiconductor layer 1102 over the second vertical structure 120 are respectively formed for NMOS and PMOS.

Figure 12:
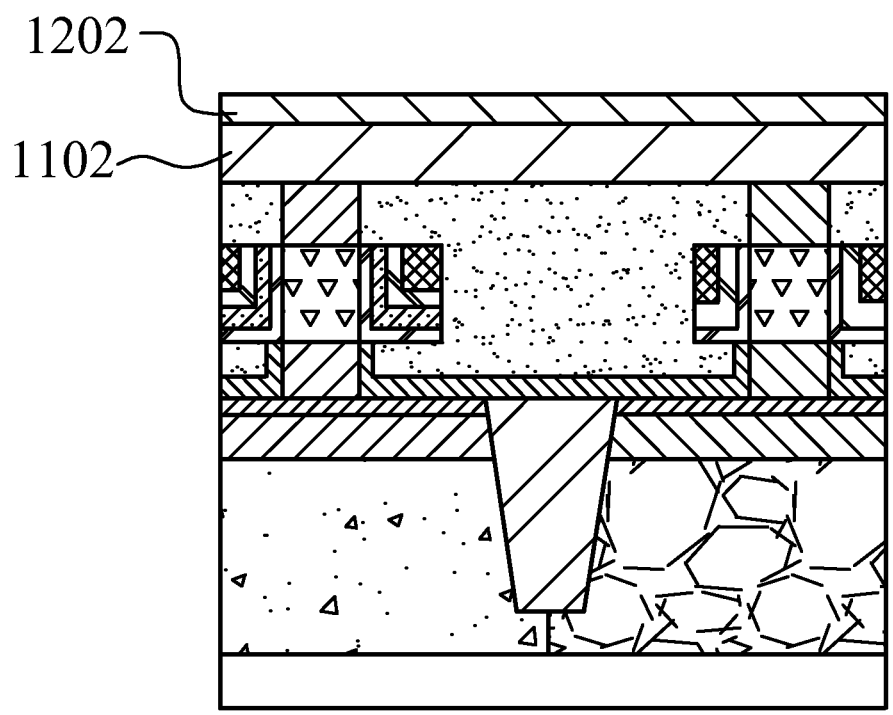
FIG. 12 is a sectional view illustrating the exemplary semiconductor device in accordance with some embodiments.

FIG. 12 is a sectional view illustrating the exemplary semiconductor device in accordance with some embodiments. As shown in FIG. 12, a second metal layer 1202 for silicide formation is formed over the semiconductor layer 1102. The second metal layer 1202 is made of, for example, nickel, titanium, cobalt, nickel platinum and combinations thereof and may be further with a titanium nitride cap layer (not shown). The thickness of the second metal layer 1202 may be about 5 angstrom to about 1000 angstrom.

Figure 13:
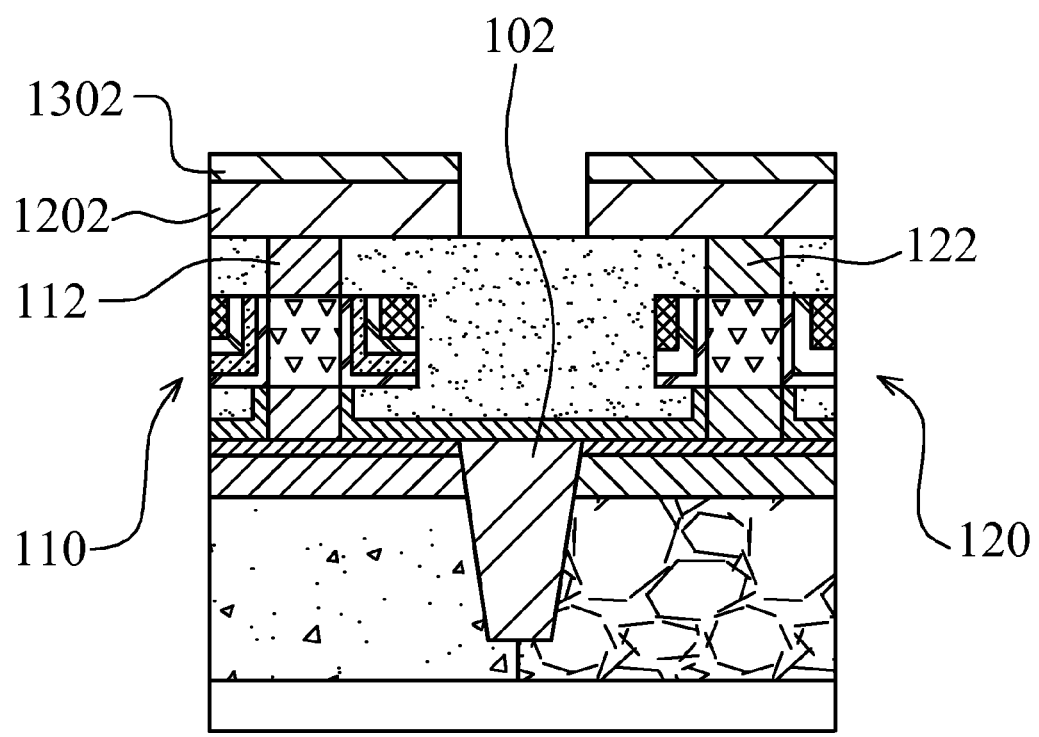
FIG. 13 is a sectional view illustrating the exemplary semiconductor device in accordance with some embodiments.

FIG. 13 is a sectional view illustrating the exemplary semiconductor device in accordance with some embodiments. As shown in FIG. 13, a portion of the semiconductor layer 1202 and a portion of the second metal layer 1302 over the STI 102 are removed to disconnect the first drain 112 of the first vertical structure 110 and the second drain 122 of the second vertical structure 120 by an etching process.

Figure 14:
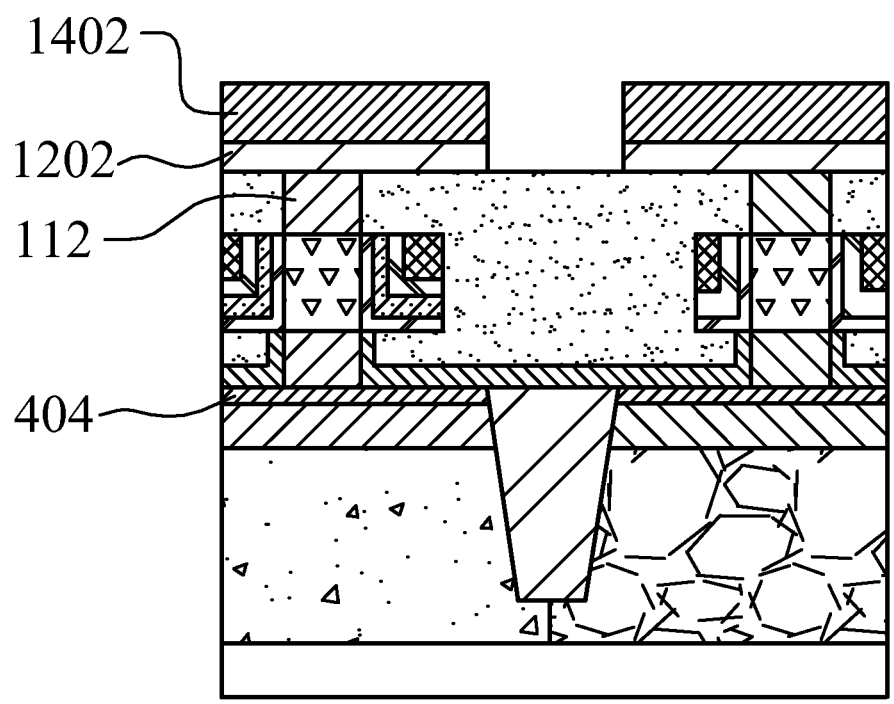
FIG. 14 is a sectional view illustrating the exemplary semiconductor device in accordance with some embodiments.

FIG. 14 is a sectional view illustrating the exemplary semiconductor device in accordance with some embodiments. As shown in FIGS. 13 and 14, thermal anneal is performed on the semiconductor layer 1202 to form the top silicide 1402. The semiconductor layer 1202 is partially consumed and a portion of the semiconductor layer 1202 remains.

Therefore, the top silicide 1402 does not directly contact with the first drain 112, and the semiconductor layer 1202 does. The semiconductor layer 1202 provides a low contact resistivity between the semiconductor layer 1202 (highly doped epitaxy layer) and the first drain 112 so as to reduce the contact resistance of first drain 112 to enhance device performance.

Figure 15:
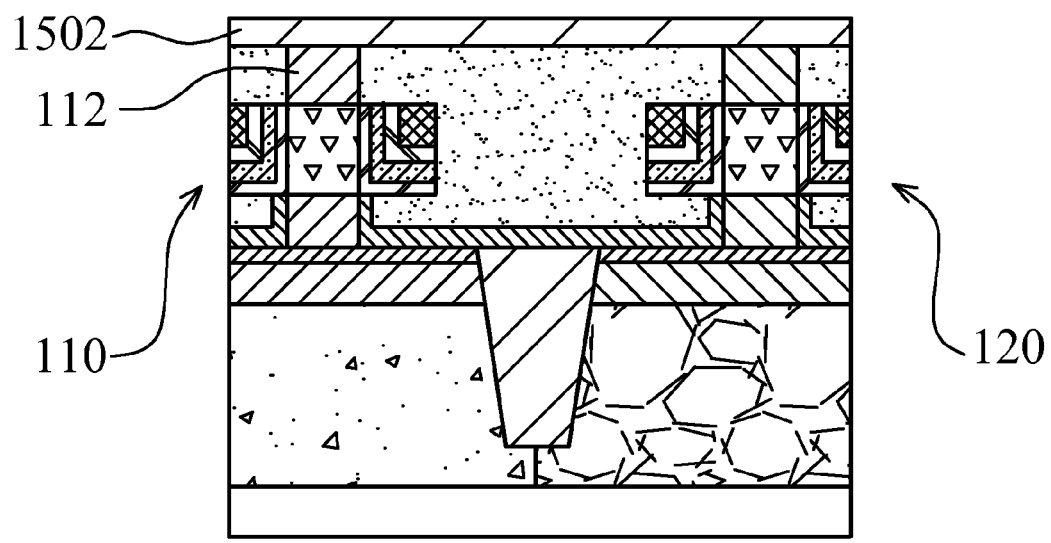
FIG. 15 is a sectional view illustrating the exemplary semiconductor device in accordance with some embodiments.

FIG. 15 is a sectional view illustrating the exemplary semiconductor device in accordance with some embodiments. Continuing from FIG. 6, as shown in FIG. 15, a semiconductor layer 1502 is formed over the first drain 112. In some embodiment, a portion of the semiconductor layer 1502 over the first vertical structure 110 and another portion of the semiconductor layer 1502 over the second vertical structure 120 are respectively formed for NMOS and PMOS.

Figure 16:
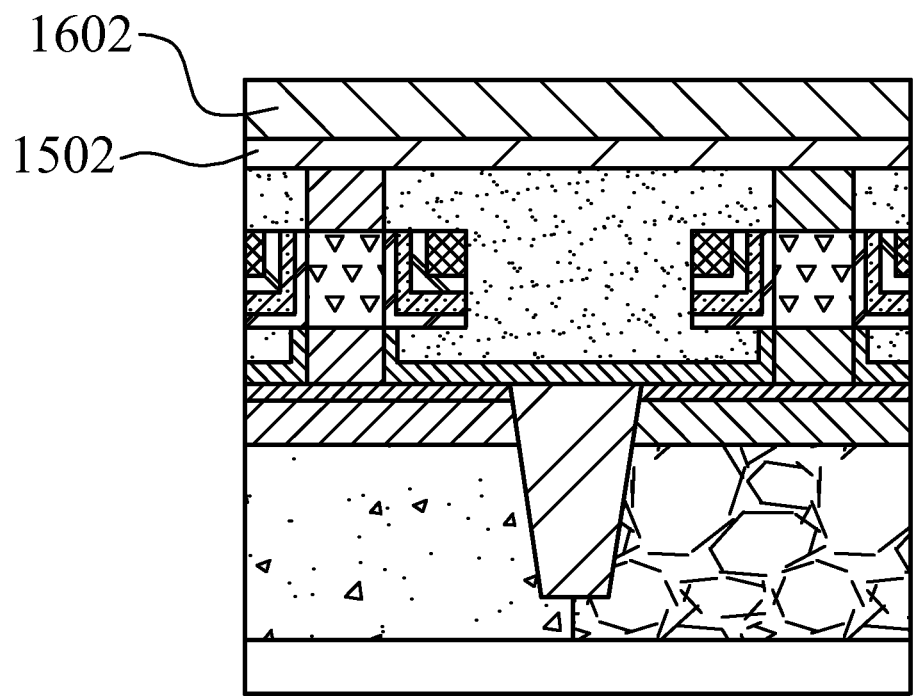
FIG. 16 is a sectional view illustrating the exemplary semiconductor device in accordance with some embodiments.

FIG. 16 is a sectional view illustrating the exemplary semiconductor device in accordance with some embodiments. As shown in FIG. 16, a second metal layer, which is thicker than the second metal layer 802 in FIG. 8, is formed over the semiconductor layer 1502. The second metal layer 1602 is made of, for example, nickel, titanium, cobalt, nickel platinum and combinations thereof and may be further with a titanium nitride cap layer (not shown).

Figure 17:
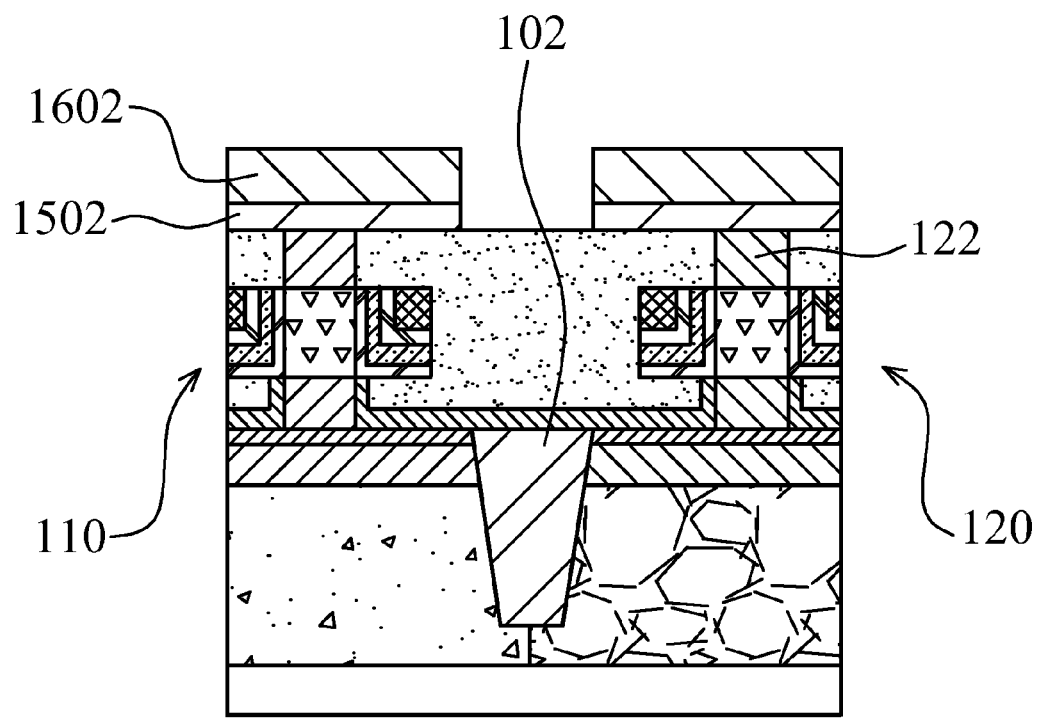
FIG. 17 is a sectional view illustrating the exemplary semiconductor device in accordance with some embodiments.

FIG. 17 is a sectional view illustrating the exemplary semiconductor device in accordance with some embodiments. As shown in FIG. 17, a portion of the semiconductor layer 1502 and a portion of the second metal layer 1602 over the STI 102 are removed to disconnect the first drain 112 of the first vertical structure 110 and the second drain 122 of the second vertical structure 120 by an etching process.

Figure 18:
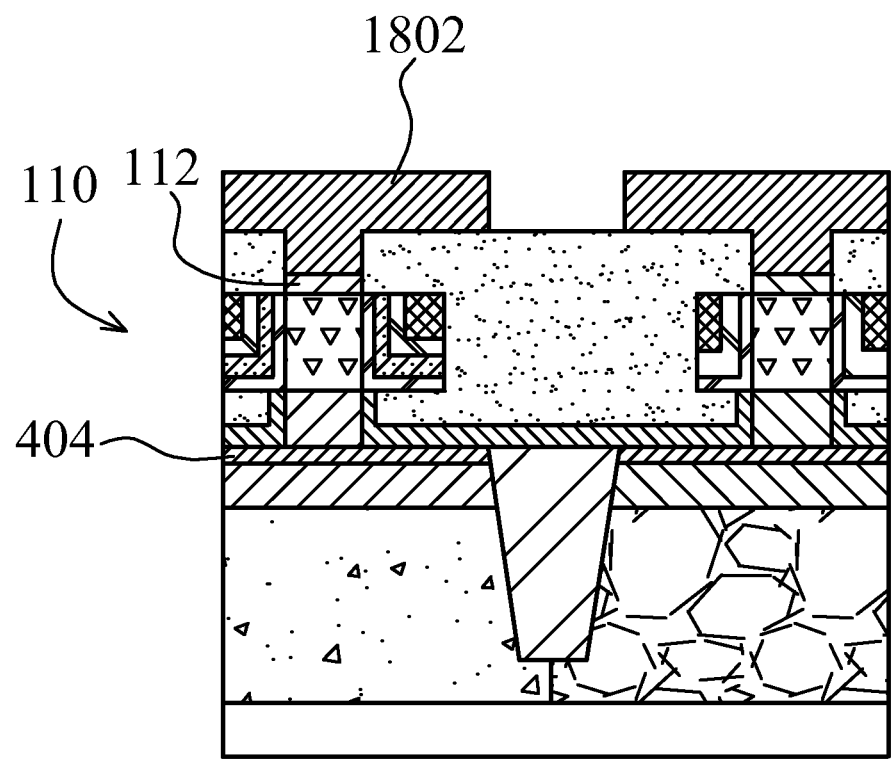
FIG. 18 is a sectional view illustrating the exemplary semiconductor device in accordance with some embodiments.

FIG. 18 is a sectional view illustrating the exemplary semiconductor device in accordance with some embodiments. As shown in FIGS. 17 and 18, thermal anneal is performed on and fully consumes the semiconductor layer 1502 to form the top silicide 1802. Additionally, a portion of the first drain 112 is consumed during thermal anneal and transmuted into a portion of the top silicide 1802. In some embodiment, the first drain 112 is fully consumed, and the top silicide 1802 works as a metal silicide drain of first vertical structure 110.

Furthermore, as shown in FIGS. 14 and 18, each of the top silicide 1402 in FIG. 14 and the top silicide 1802 in FIG. 18 has the horizontal cross section area symmetrical to the bottom silicide 404. In some embodiment, each of the widths of the top silicides 1402, 1802 is identical to the width of the bottom silicide 404.

In some embodiments, the top silicide is replaced by a metal-insulator-semiconductor (MIS) structure. The processes of formation of MIS structure are depicted as follows.

Figure 19:
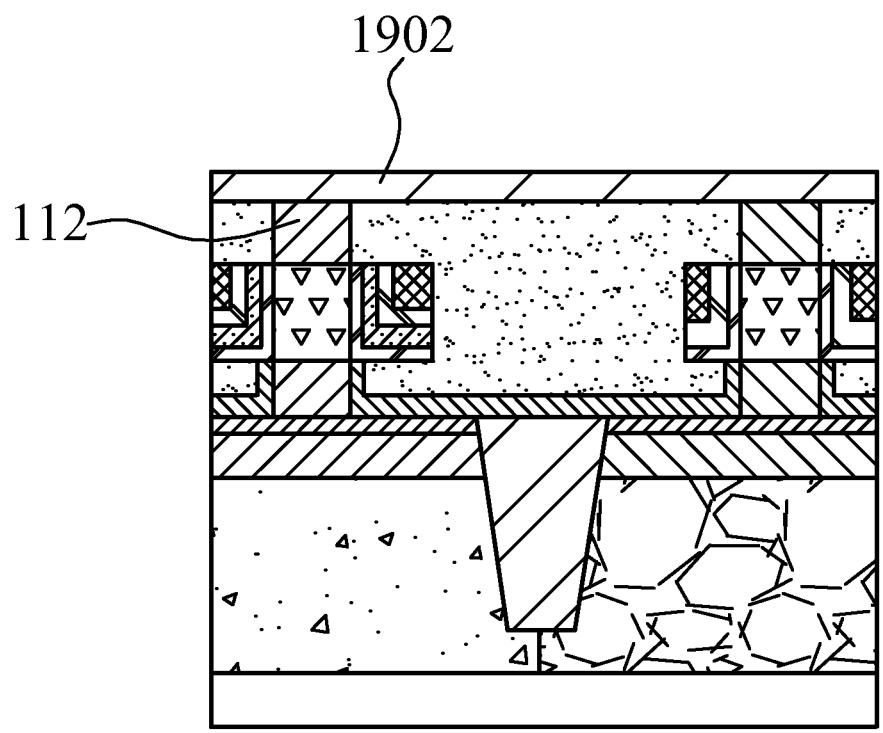
FIG. 19 is a sectional view illustrating the exemplary semiconductor device in accordance with some embodiments.

FIG. 19 is a sectional view illustrating the exemplary semiconductor device in accordance with some embodiments. As shown in FIG. 19, a semiconductor layer 1902 is formed over the first drain 112. In the embodiment, the semiconductor layer 1902 includes a n-type or p-type doped silicon.

Figure 20:
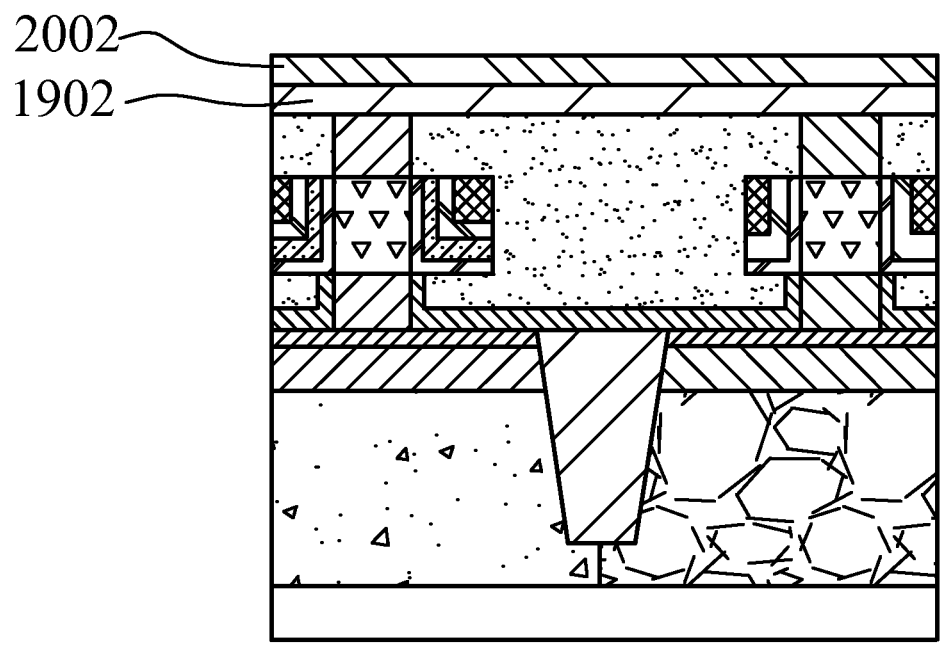
FIG. 20 is a sectional view illustrating the exemplary semiconductor device in accordance with some embodiments.

FIG. 20 is a sectional view illustrating the exemplary semiconductor device in accordance with some embodiments. As shown in FIG. 20, an insulation layer 2002 is formed over the semiconductor layer 1902. In the embodiment, the insulation layer 2002 may be $SiO_x$, SiN, $TiO_2$, ZnO, $HfO_2$, $Al_2O_3$ or the combination thereof. The thickness of the insulation layer 2002 may be about 2 angstrom to 200 angstrom.

Figure 21:
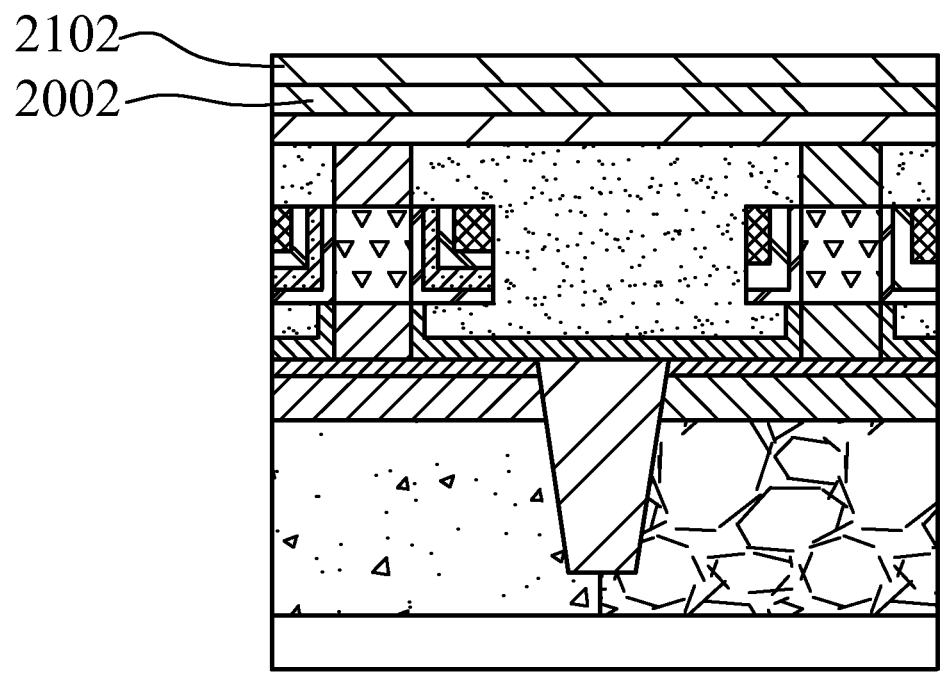
FIG. 21 is a sectional view illustrating the exemplary semiconductor device in accordance with some embodiments.

FIG. 21 is a sectional view illustrating the exemplary semiconductor device in accordance with some embodiments. As shown in FIG. 21, a MIS metal layer 2102 is formed over the insulation layer 2002. In the embodiment, the MIS metal layer 2102 may be any type of metal or alloy, such as W, Ti, TiN, or Al. The thickness of the MIS metal layer 2102 may be about 5 angstrom to about 500 angstrom.

Figure 22:
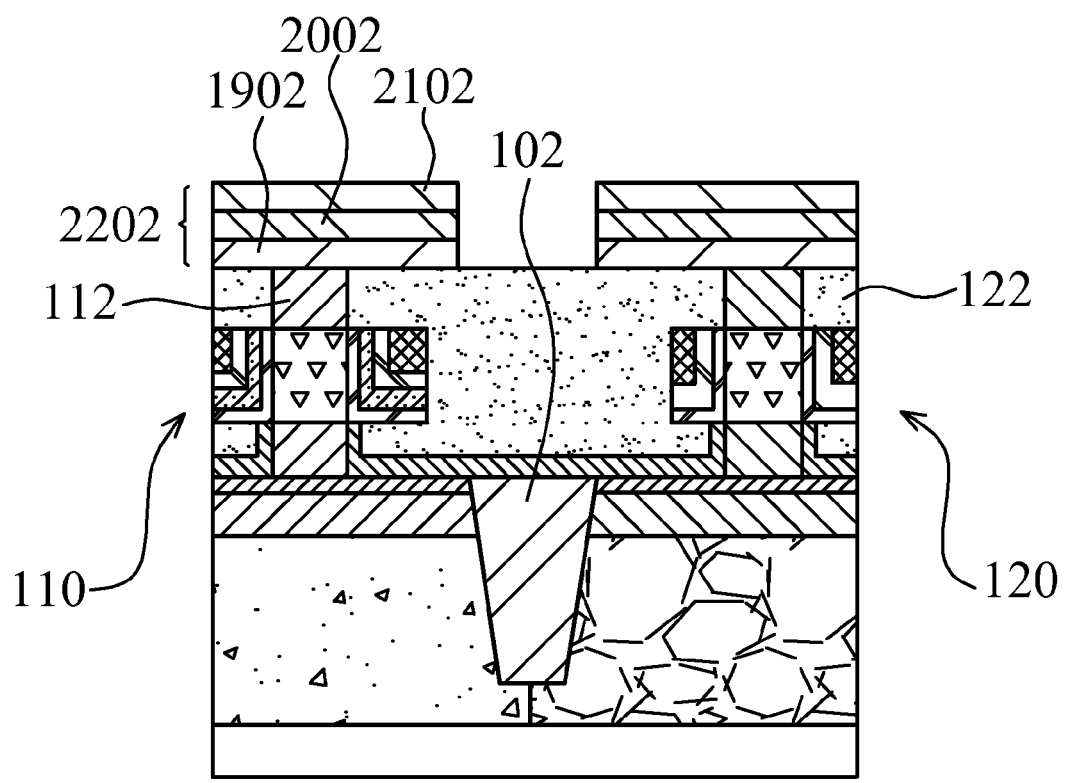
FIG. 22 is a sectional view illustrating the exemplary semiconductor device in accordance with some embodiments.

FIG. 22 is a sectional view illustrating the exemplary semiconductor device in accordance with some embodiments. As shown in FIG. 22, a portion of the semiconductor layer 1902, a portion of the insulation layer 2002 and a portion of the MIS metal layer 2102 over the STI 102 is removed to disconnect the first drain 112 of the first vertical structure 110 and the second drain 122 of the second vertical structure 120 by an etching process. As such, a combination of the semiconductor layer 1902, the insulation layer 2002 and the MIS metal layer 2102, which is a metal-insulator-semiconductor (MIS) structure 2202, is formed over the first drain 112.

Figure 23:
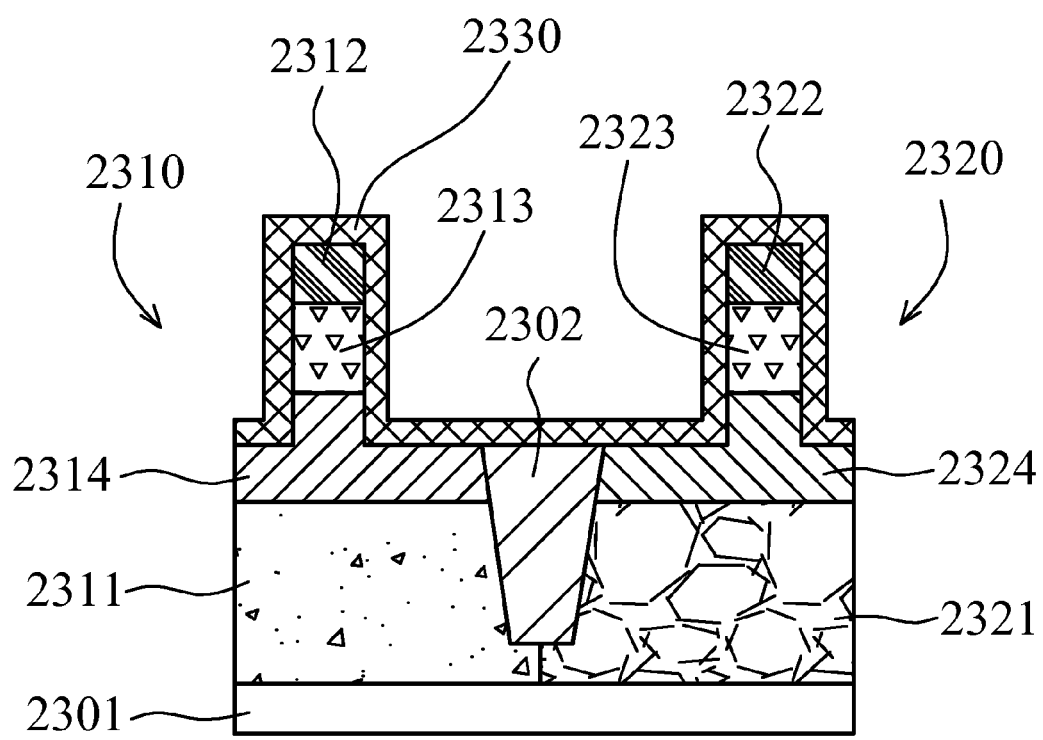
FIG. 23 is a sectional view illustrating an exemplary semiconductor device in accordance with some embodiments.

FIG. 23 is a sectional view illustrating an exemplary semiconductor device in accordance with some embodiments. As shown in FIG. 23, a semiconductor device 2300 is provided. In the semiconductor device 2300, a first vertical structure 2310 and a second vertical structure 2320 are provided over a substrate 2301. The first vertical structure 2310 and the second vertical structure 2320 may be vertical-gate-all-around devices electrically isolated by shallow trench isolation 2302. The first vertical structure 2310 may be a PMOS, and may include an n-well 2311, a first source 2314, a first channel 2313, and a first hard mask 2312. The second vertical structure 2320 may be a NMOS, and may include a p-well 2321, a second source 2324, a second channel 2323, and a second hard mask 2322.

The first source 2314 is disposed over the n-well 2311. The first channel 2313 is disposed over the first source 2314. The first hard mask 2312 is disposed over the first channel 2313. The second source 2324 is disposed over the p-well 2321. The second channel 2323 is disposed over the second source 2324. The second hard mask 2322 is disposed over the second channel 2323. The following procedures may be performed on the first vertical structure 2310 and the second vertical structure 2320, so will only be discussed below with respect to the first vertical structure 2310. Additionally, a spacer film 2330 is formed over the first vertical structure 2310 and the second vertical structure 2320. The material of the spacer film 2330 may be, for example, silicon nitride.

In one embodiment, the substrate 2301 includes a crystalline silicon substrate. In some alternative embodiments, the substrate 2301 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 2301 may include an epitaxial layer (epi-layer), may be strained for performance enhancement, and/or may include a silicon-on-insulator (SOI) structure.

Figure 24:
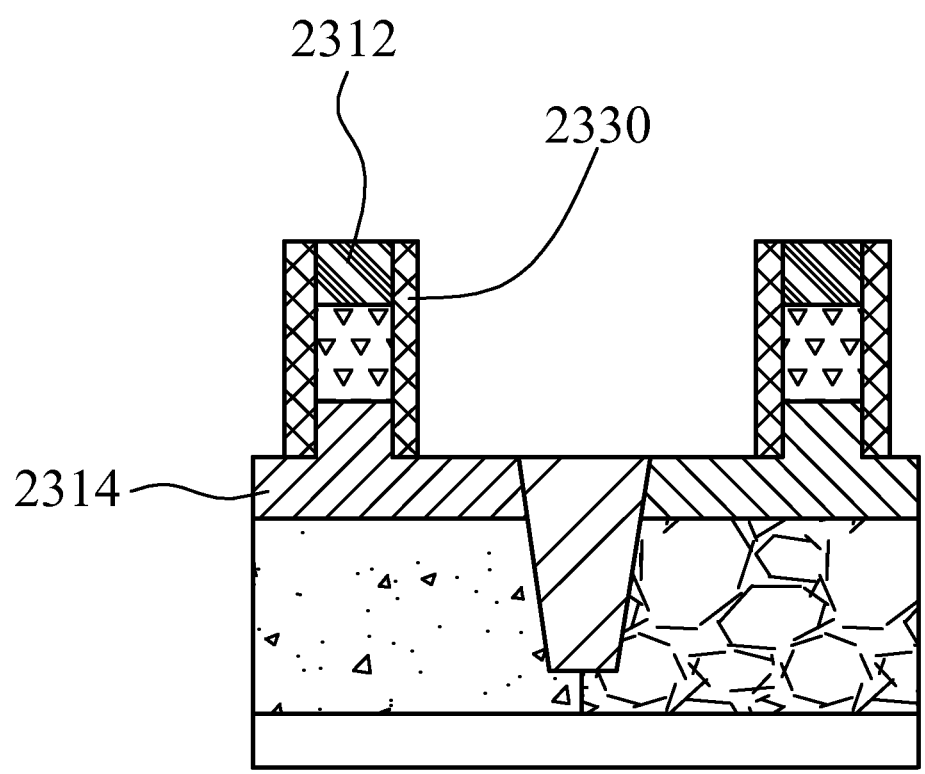
FIG. 24 is a sectional view illustrating the exemplary semiconductor device in accordance with some embodiments.

FIG. 24 is a sectional view illustrating the exemplary semiconductor device in accordance with some embodiments. As shown in FIG. 24, a portion of the spacer film 2330 is etched to expose the first source 2314 and the first hard mask 2312 for formation of silicides later.

Figure 25:
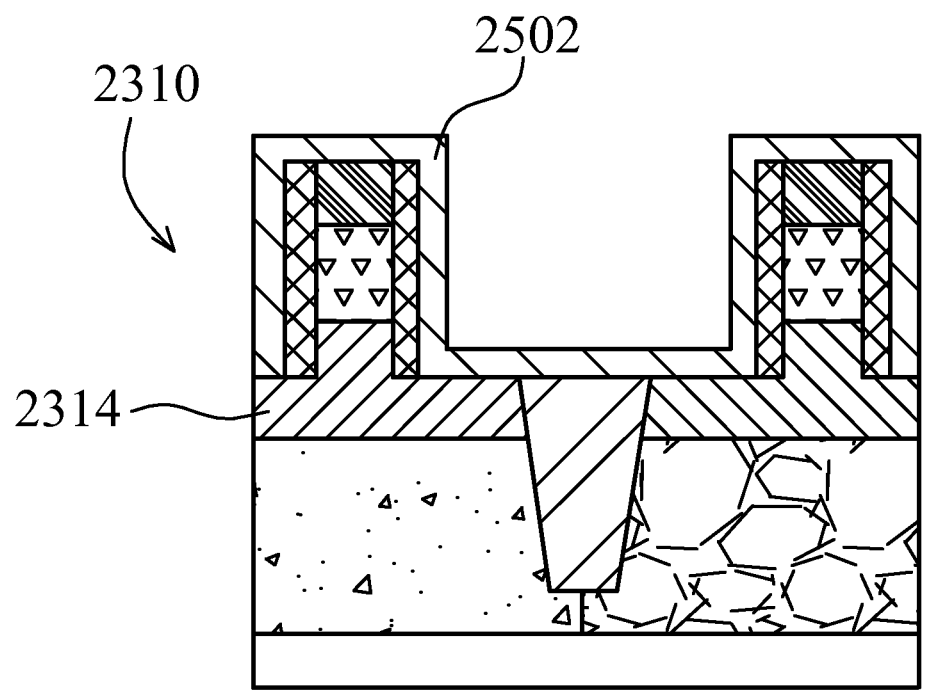
FIG. 25 is a sectional view illustrating the exemplary semiconductor device in accordance with some embodiments.

FIG. 25 is a sectional view illustrating the exemplary semiconductor device in accordance with some embodiments. As shown in FIG. 25, a first metal layer 2502 for silicide formation is formed over the first vertical structure 2310. The first metal layer 2502 is made of, for example, nickel, titanium, cobalt, nickel platinum and combinations thereof and may be further with a titanium nitride cap layer (not shown). The thickness of the first metal layer 2502 may be about 5 angstrom to about 1000 angstrom.

Furthermore, before the formation of the first metal layer 2502, a pre-amorphization implant (PAI) process is optional and may be performed on the first source 2314 to enhance formation of silicides in the following processes. The detailed PAI information may include: implanting with dopant of Ge, Si, Xe or other species and combination thereof, a PAI angle of 0 to 90 degree, a PAI energy of 100 eV to 100 KeV, and a PAI dosage of $10^{17}/cm^3$ to $5*10^{21}/cm^3$.

Figure 26:
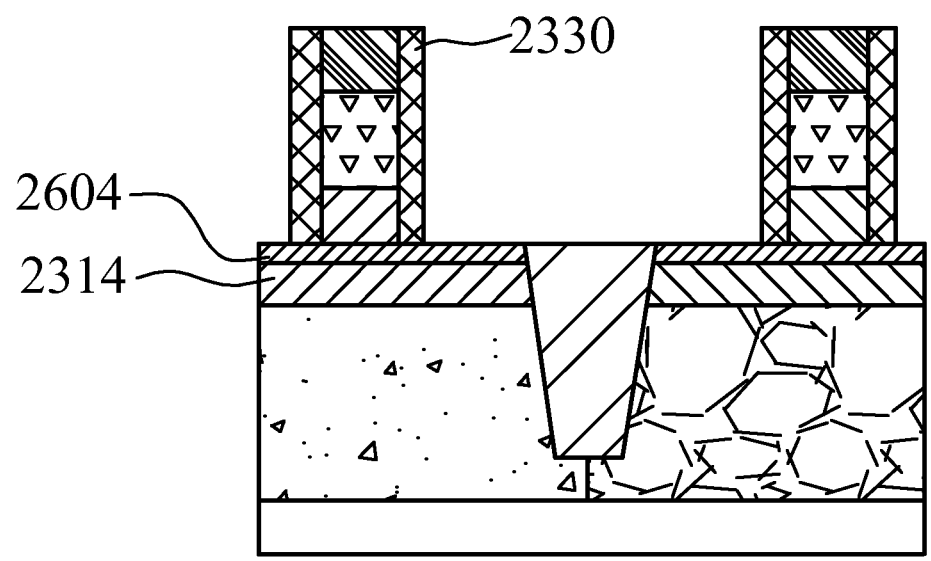
FIG. 26 is a sectional view illustrating the exemplary semiconductor device in accordance with some embodiments.

FIG. 26 is a sectional view illustrating the exemplary semiconductor device in accordance with some embodiments. As shown in FIGS. 25 and 26, thermal anneal is performed on the first metal layer 2502, and unreacted portions of the first metal layer 2502 is removed by a wet etching process. Accordingly, a bottom silicide 2604 penetrating the first source 2314 is formed. The bottom silicide 2604 is made of, for example, titanium disilicide or nickel platinum silicide. When the bottom silicide 2604 is made of titanium disilicide, the bottom silicide 2604 may be two division without mergence and penetration of the first source 2314.

The thermal anneal may be a rapid thermal anneal (RTA). When the RTA is applied, the annealing temperature is about 100° C. to about 1000° C. and in a duration of about 0.01 seconds to about 10 seconds. If the thermal anneal proceeds only several milliseconds, the annealing temperature is about 500° C. to about 1200° C. Moreover, the thickness of the bottom silicide 2604 may be about 10 angstrom to 1000 angstrom.

Figure 27:
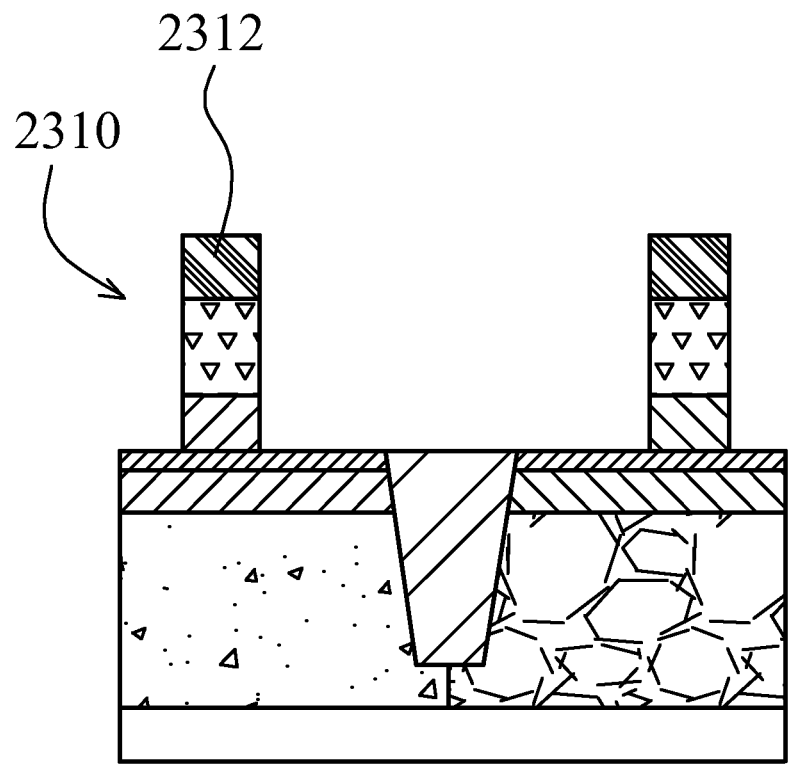
FIG. 27 is a sectional view illustrating the exemplary semiconductor device in accordance with some embodiments.

FIG. 27 is a sectional view illustrating the exemplary semiconductor device in accordance with some embodiments. As shown in FIGS. 26 and 27, the spacer film 2330 is removed. In the following processes, the hard mask 2312 will be removed and other components of the first vertical structure 2310 will be introduced.

Figure 28:
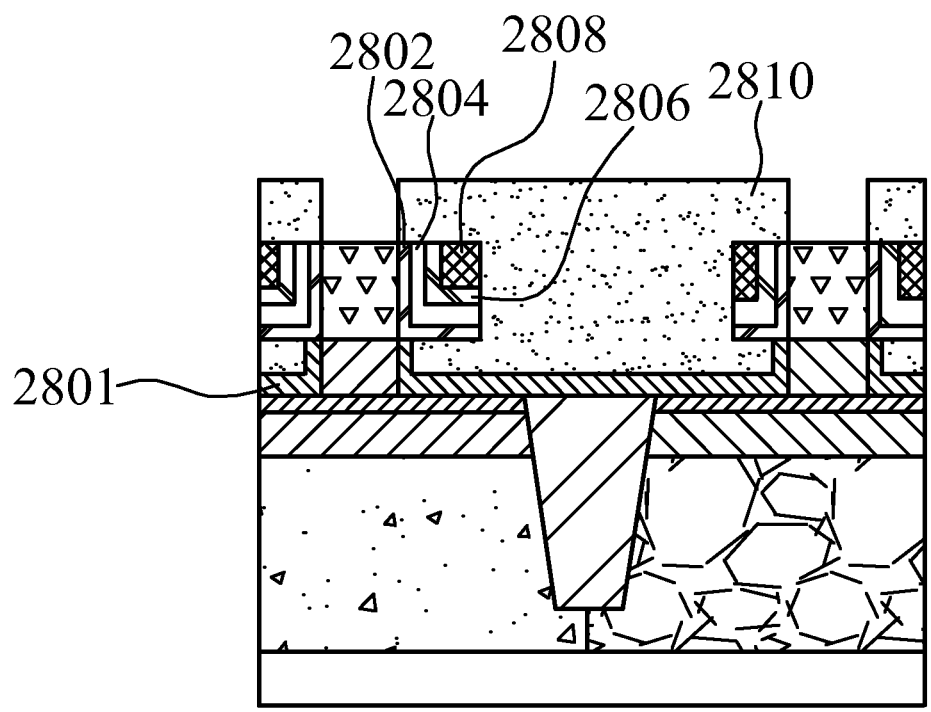
FIG. 28 is a sectional view illustrating the exemplary semiconductor device in accordance with some embodiments.

FIG. 28 is a sectional view illustrating the exemplary semiconductor device in accordance with some embodiments. As shown in FIG. 28, an etch stop layer 2801, a high-k dielectric layer 2802, work function metal (WFM) layers 2804, 2806, a metal gate 2808 and an oxide layer 2810 are formed in the semiconductor device 2300.

Figure 29:
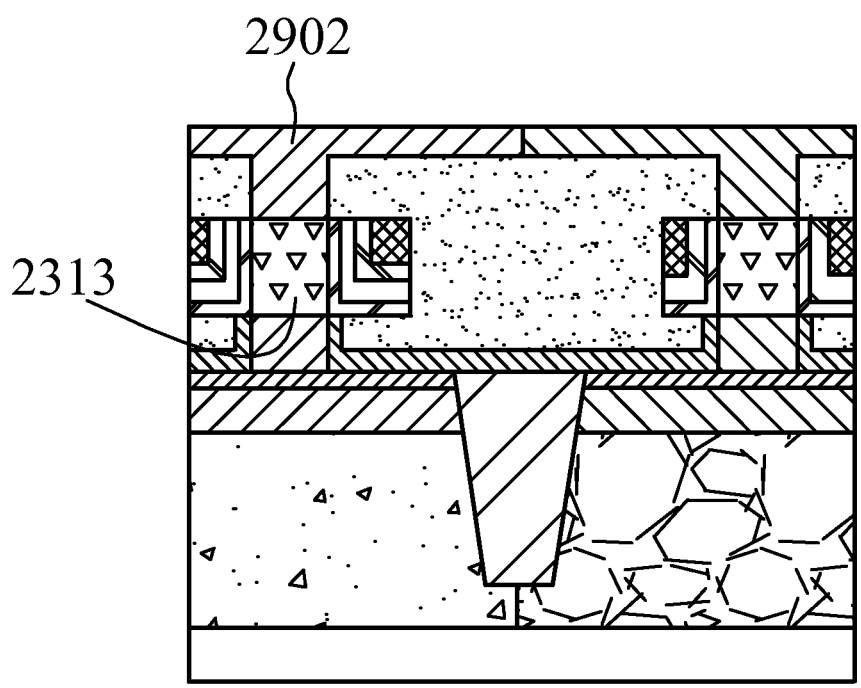
FIG. 29 is a sectional view illustrating the exemplary semiconductor device in accordance with some embodiments.

FIG. 29 is a sectional view illustrating the exemplary semiconductor device in accordance with some embodiments. As shown in FIG. 29, a first drain 2902 is formed over the first channel 2313. In the embodiment, formation of the first drain 2902 includes a low-thermal epitaxy deposition or PVD silicon deposition. In some alternative embodiments, the first drain 2902 may be made of germanium. A pre-amorphization implant (PAI) process is optional and may be performed on the first drain 2902 to enhance formation of silicides in the following processes. The detailed PAI information may include: implanting with dopant of Ge, Si, Xe or other species and combination thereof, a PAI angle of 0 to 90 degree, a PAI energy of 100 eV to 100 KeV, and a PAI dosage of $10^{17}/cm^3$ to $5*10^{21}/cm^3$.

Additionally, the first drain 2902 may be formed by using PVD, CVD or epitaxial growth deposition at the temperature of about 300° C. to about 1000° C., and the thickness of the first drain 2902 may be about 10 angstrom to 1000 angstrom. The first drain 2902 may be further doped with a dosage of $10^{15}/cm^3$ to $5*10^{22}/cm^3$. An optional RTA may be applied to the first drain 2902, and the annealing temperature is about 100° C. to about 1000° C. and in duration of about 0.01 seconds to about 10 seconds. If the thermal anneal proceeds only several milliseconds, the annealing temperature is about 500° C. to about 1200° C.

Figure 30:
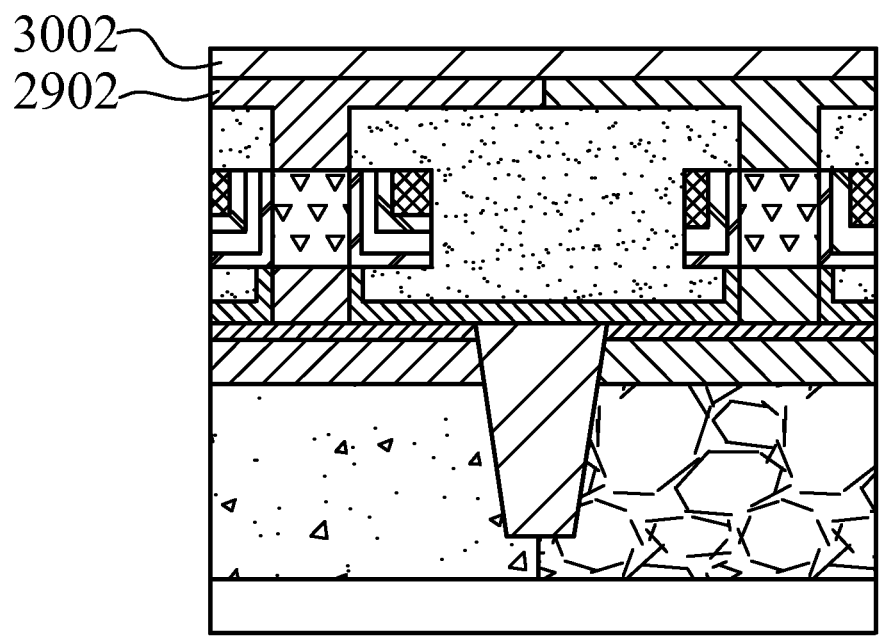
FIG. 30 is a sectional view illustrating the exemplary semiconductor device in accordance with some embodiments.

FIG. 30 is a sectional view illustrating the exemplary semiconductor device in accordance with some embodiments. As shown in FIG. 30, a second metal layer 3002 for silicide formation is formed over the first drain 2902. The second metal layer 3002 is made of, for example, nickel, titanium, cobalt, nickel platinum and combinations thereof and may be further with a titanium nitride cap layer (not shown). The thickness of the second metal layer 3002 may be about 5 angstrom to 1000 angstrom.

Figure 31:
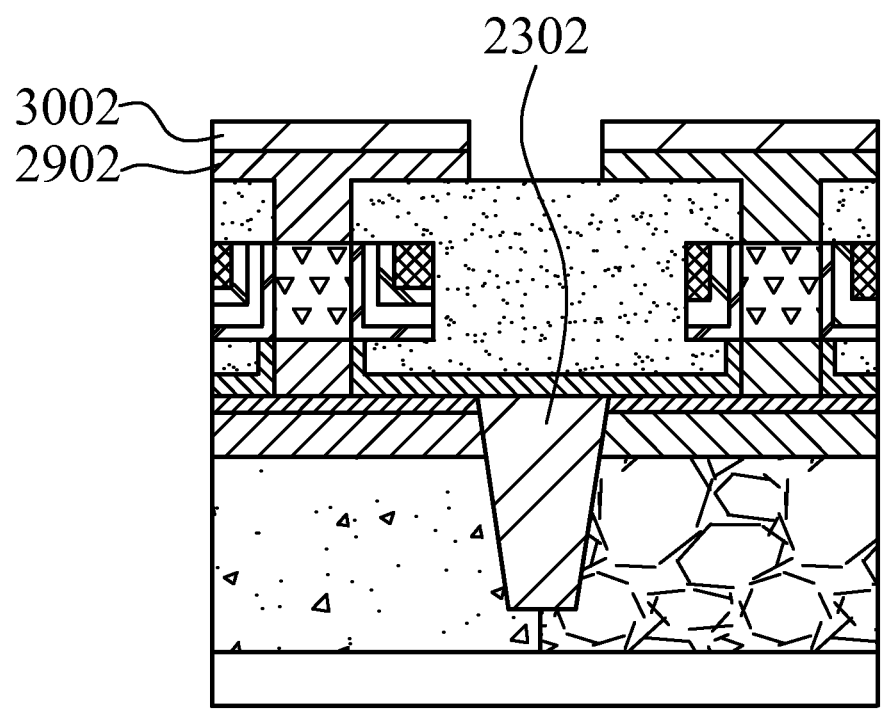
FIG. 31 is a sectional view illustrating the exemplary semiconductor device in accordance with some embodiments.

FIG. 31 is a sectional view illustrating the exemplary semiconductor device in accordance with some embodiments. As shown in FIG. 31, a portion of the first drain 2902 and a portion of the second metal layer 3002 over the STI 2302 are removed.

Figure 32:
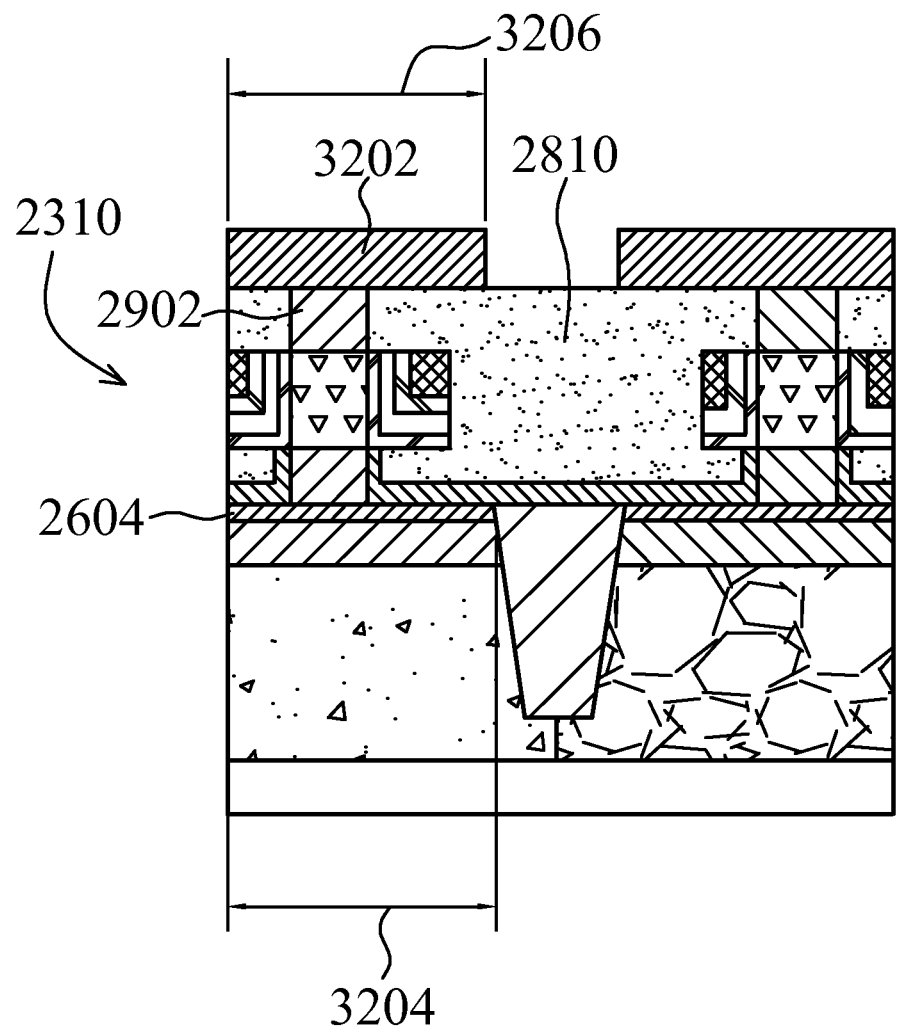
FIG. 32 is a sectional view illustrating the exemplary semiconductor device in accordance with some embodiments.

FIG. 32 is a sectional view illustrating the exemplary semiconductor device in accordance with some embodiments. As shown in FIGS. 31 and 32, thermal anneal is performed on and consumes a portion of the first drain 2902 above the oxide layer 2810. Accordingly, the top silicide 3202 is formed contacting with the first drain 2902 and has a larger horizontal cross section area than the first drain 2902. In some embodiment, the top silicide 3202 has the horizontal cross section area symmetrical to the bottom silicide 2604. In some embodiment, the width 3206 of the top silicide 3202 is identical to the width 3204 of the bottom silicide 2604. The top silicide 3202 is made of, for example, titanium disilicide or nickel platinum silicide.

In some embodiment, the first drain 2902 is fully consumed, and the top silicide 3202 works as a metal silicide drain of first vertical structure 2310. In some embodiments, the top silicide 3202 is replaced by a metal-insulator-semiconductor (MIS) structure. The processes of formation of MIS structure are similar to those depicted in FIGS. 19-22.

Figure 33:
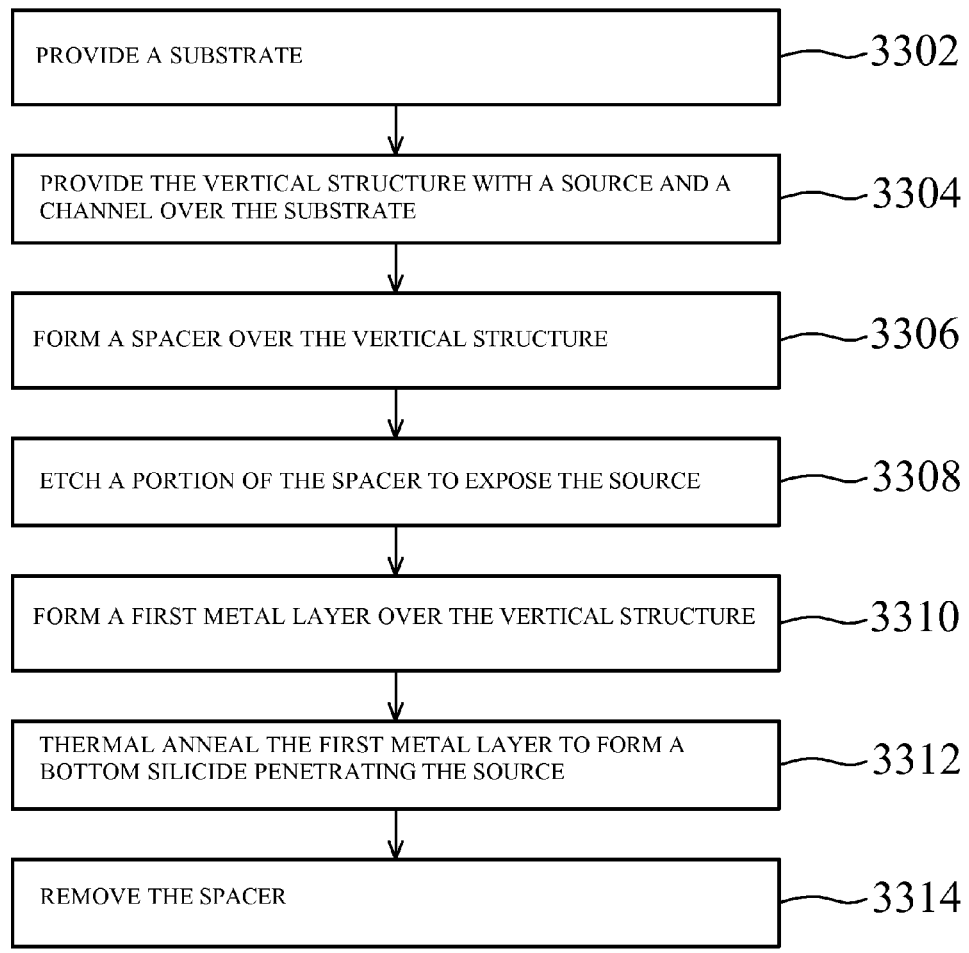
FIG. 33 is a flow chart for forming a vertical structure in accordance with some embodiments.

FIG. 33 is a flow chart for forming a vertical structure in accordance with some embodiments. As shown in FIG. 33, a method 3300 is provided. The method 3300 includes the following operations: providing a substrate (3302); providing the vertical structure with a source and a channel over the substrate (3304); forming a spacer over the vertical structure (3306); etching a portion of the spacer to expose the source (3308); forming a first metal layer over the vertical structure (3310); and thermal annealing the first metal layer to form a silicide beneath the vertical structure (3312); and removing the spacer (3314).

The operation 3304 may further include: providing the vertical structure with a drain, the source and the channel over the substrate. The method 3300 may further include: thermal annealing the first metal layer to form a temporary silicide contacting with the drain; and removing the temporary silicide contacting with the drain. The method 3300 may further include: forming a semiconductor layer over the drain; forming a second metal layer over the semiconductor layer; and thermal annealing the second metal layer to form a top silicide contacting with the drain and having a larger horizontal cross section area than the drain. The operation of thermal annealing the second metal layer to form the top silicide contacting with the drain and having the larger area than the drain further includes: thermal annealing the second metal layer to form the top silicide having the horizontal cross section area symmetrical to the bottom silicide. The method 3300 may further include forming a metal-insulator-semiconductor structure over the drain.

The operation 3304 may further include: providing the vertical structure with a hard mask, the source and the channel over the substrate. The method 3300 may further include removing the hard mask over the channel. The method 3300 may further include: forming a drain for the vertical structure over the channel, a portion of the drain having a larger horizontal cross section area than the channel; forming a second metal layer over the drain; and thermal annealing the second metal layer to form a top silicide contacting with the drain and having a larger horizontal cross section area than the drain. The operation of thermal annealing the second metal layer to form the top silicide contacting with the drain and having the larger area than the drain further includes: thermal annealing the second metal layer to form the top silicide having the horizontal cross section area symmetrical to the bottom silicide. The method 3300 may further include: forming a drain for the vertical structure over the channel, a portion of the drain having a larger horizontal cross section area than the channel; and forming a metal-insulator-semiconductor structure over the drain.

The operation 3308 may further include: forming the first metal layer made of nickel platinum over the vertical structure.

Figure 34:
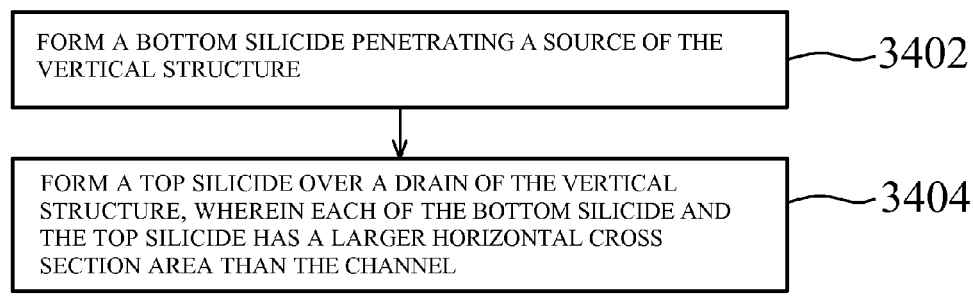
FIG. 34 is a flow chart for forming a vertical structure in accordance with some embodiments.

FIG. 34 is a flow chart for forming a vertical structure in accordance with some embodiments. As shown in FIG. 34, a method 3400 is provided. The method 3400 includes the following operations: forming a bottom silicide beneath the vertical structure (3402); and forming a top silicide over a drain of the vertical structure, wherein each of the bottom silicide and the top silicide has a larger horizontal cross section area than the channel (3404).

The method 3400 further includes performing a pre-amorphization implant (PAI) on the bottom silicide and the top silicide. The operation of performing the pre-amorphization implant (PAI) on the bottom silicide further includes: implanting with a PAI angle of 0 to 90 degree, a PAI energy of 100 eV to 100 KeV, and a PAI dosage of 1017/cm3 to 5*1021/cm3. The operation 3402 may further include: forming the bottom silicide with a thickness of about 10 to about 1000 angstrom by using rapid thermal annealing at a temperature of about 300° C. to about 1000° C. and in a duration of about 0.01 seconds to about 10 seconds.

The operation 3404 may further include: forming the top silicide with a thickness of about 10 to about 1000 angstrom by using rapid thermal annealing at a temperature of about 300° C. to about 1000° C. and in a duration of about 0.01 seconds to about 10 seconds. The operation 3404 may further include: form the top silicide having the horizontal cross section area symmetrical to the bottom silicide.

According to an exemplary embodiment, a vertical structure is provided. The vertical structure includes: a source; a channel over the source; a drain over the channel; and a bottom silicide penetrating the source.

According to an exemplary embodiment, a method of forming a vertical structure is provided. The method includes the following operations: providing a substrate; providing the vertical structure with a source and a channel over the substrate; forming a spacer over the vertical structure; etching a portion of the spacer to expose the source; forming a first metal layer over the vertical structure; and thermal annealing the first metal layer to form a bottom silicide penetrating the source; and removing the spacer.

According to an exemplary embodiment, a method of forming a vertical structure is provided. The method includes the following operations: forming a bottom silicide penetrating a source of the vertical structure; and forming a top silicide over a drain of the vertical structure, wherein each of the bottom silicide and the top silicide has a larger horizontal cross section area than the channel.

According to an exemplary embodiment, a method of forming a vertical structure is provided. The method includes the following operations: providing a substrate; providing the vertical structure with a source and a channel over the substrate; forming a spacer over the vertical structure; etching a portion of the spacer to expose the source; forming a first metal layer over the vertical structure; thermal annealing the first metal layer to form a silicide beneath the vertical structure; and substantially removing the spacer.

According to an exemplary embodiment, a method of forming a vertical structure is provided. The method includes the following operations: forming a bottom silicide beneath the vertical structure; and forming a top silicide over a drain of the vertical structure, wherein each of the bottom silicide and the top silicide has a larger horizontal cross section area than the channel.

According to an exemplary embodiment, a vertical structure is provided. The vertical structure includes: a source; a channel over the source; a drain over the channel; and a bottom silicide beneath a portion of the source and the channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
providing, over the substrate, a vertical structure with a source, a drain, and a channel, the channel overlying a top of the source;
forming a spacer that includes a horizontally-extending top portion extending over a top of the vertical structure and a horizontally-extending bottom portion extending over a horizontally-extending surface of the source;
etching the bottom portion of the spacer to expose the source;
forming a first metal layer over the vertical structure;
thermal annealing the first metal layer to form (i) a silicide beneath the vertical structure and (ii) a temporary silicide contacting the drain;
substantially removing the spacer; and
removing the temporary silicide from the drain.

2. The method of claim 1, further comprising:
forming a semiconductor layer over the drain;
forming a second metal layer over the semiconductor layer; and
thermal annealing the second metal layer to form a top silicide contacting the drain and having a larger horizontal cross section area than the drain.

3. The method of claim 2, wherein thermal annealing the second metal layer to form the top silicide contacting with the drain and having the larger area than the drain further comprises: thermal annealing the second metal layer to form the top silicide having the horizontal cross section area symmetrical to a bottom silicide.

4. The method of claim 1, wherein providing the vertical structure further comprises: providing the vertical structure with a hard mask, the source and the channel over the substrate.

5. The method of claim 4, further comprising: removing the hard mask over the channel.

6. The method of claim 5, further comprising:
forming a drain for the vertical structure over the channel, a portion of the drain having a larger horizontal cross section area than the channel;
forming a second metal layer over the drain; and
thermal annealing the second metal layer to form a top silicide contacting with the drain and having a larger horizontal cross section area than the drain.

7. The method of claim 6, wherein thermal annealing the second metal layer to form the top silicide contacting with the drain and having the larger area than the drain further comprises: thermal annealing the second metal layer to form the top silicide having the horizontal cross section area symmetrical to a bottom silicide.

8. The method of claim 1, wherein forming the first metal layer over the vertical structure further comprises: forming the first metal layer made of nickel platinum over the vertical structure.

9. A method of forming a vertical structure, comprising:
forming a source that includes (i) a lower source section with a horizontal upward-facing lower top surface, (ii) a source projection that is narrower than the lower source section and projects upward from the lower source section, and (iii) a vertical side extending upward from the lower top surface to a top of the source projection;
forming a vertical structure that includes a drain, a channel and the source projection, wherein the drain overlies a top of the channel and the channel overlies a top of the source projection;
forming a vertical spacer that covers a vertical side of the drain, a vertical side of the channel, and the vertical side of the source projection;
after the forming of the vertical structure and the vertical spacer, forming
a bottom silicide beneath the vertical structure by the bottom silicide penetrating the source projection, such that the bottom silicide extends horizontally and is located between the lower source section and the source projection, and
a top silicide over the drain of the vertical structure; and
removing the vertical spacer section while (i) the bottom silicide remains beneath the vertical structure and (ii) the top silicide remains over the drain.

10. The method of claim 9, further comprising: performing a pre-amorphization implant (PAI) to form the bottom silicide and the top silicide.

11. The method of claim 10, wherein performing the pre-amorphization implant (PAI) to form the bottom silicide further comprises: implanting with a PAI angle of 0 to 90 degree, a PAI energy of 100 eV to 100 KeV, and a PAI dosage of $10^{17}/cm^3$ to $5*10^{21}/cm^3$.

12. The method of claim 9, wherein forming the bottom silicide beneath the vertical structure further comprises: forming the bottom silicide with a thickness of about 10 to about 1000 angstrom by using rapid thermal annealing at a temperature of about 300° C. to about 1000° C. and in a duration of about 0.01 seconds to about 10 seconds.

13. The method of claim 9, wherein forming the top silicide over the drain of the vertical structure further comprises: forming the top silicide with a thickness of about 10 to about 1000 angstrom by using rapid thermal annealing at a temperature of about 300° C. to about 1000° C. and in a duration of about 0.01 seconds to about 10 seconds.

14. The method of claim 9, wherein forming the top silicide over the drain of the vertical structure further comprises: form the top silicide having the horizontal cross section area symmetrical to the bottom silicide.

15. A method of forming a vertical structure, comprising:
providing a substrate;
providing, over the substrate, a vertical structure with a drain, a source and a channel, wherein:
the source is located directly above the substrate,
the source includes:
a horizontal upward-facing lower top surface,
a projection projecting upward from the lower top surface, and
a vertical side extending upward from the lower top surface to a top of the projection,
the drain overlies a top of the channel, and
the channel overlies the top of the source's projection;
forming, over the vertical structure, a spacer that includes:
an upper horizontal spacer section that overlies a horizontal top of the drain,
a lower horizontal spacer section that overlies the source's lower top surface, and
a vertical spacer section that covers a vertical side of the drain, a vertical side of the channel, and the source's side;
etching the spacer's lower horizontal section to expose the source's lower top surface;
etching the spacer's upper horizontal section to expose the drain's top;
forming, over the vertical structure, a first metal layer that overlies the source's lower top surface and the drain's exposed top;
thermal annealing the first metal layer to form a bottom silicide layer that includes:
a first bottom silicide layer section that overlies the source's lower top surface,
a second bottom silicide layer that extends horizontally from the first bottom silicide layer to penetrate the source's projection and to be located beneath the source's projection, and
a first top silicide layer that overlies the drain's top;
substantially removing the spacer;
removing the first top silicide layer to expose the drain's top;
forming a semiconductor layer over the drain's exposed top;
forming a second metal layer over the semiconductor layer;
thermal annealing the semiconductor layer to form a second top silicide layer that overlies the drain's top; and
removing the second metal layer.

16. A method of forming a vertical structure, comprising:
providing a substrate;
providing, over the substrate, a vertical structure with a drain, a source and a channel, wherein:
the source is located directly above the substrate,
the source includes:
a horizontal upward-facing lower top surface,
a projection projecting upward from the lower top surface, and
a vertical side extending upward from the lower top surface to a top of the projection,
the drain overlies a top of the channel, and
the channel overlies the top of the source's projection;
forming, over the vertical structure, a spacer that includes:
an upper horizontal spacer section that overlies a horizontal top of the drain,
a lower horizontal spacer section that overlies the source's lower top surface, and
a vertical spacer section that covers a vertical side of the drain, a vertical side of the channel, and the source's side;
etching the spacer's lower horizontal section to expose the source's lower top surface;
etching the spacer's upper horizontal section to expose the drain's top;
forming, over the vertical structure, a first metal layer that overlies the source's lower top surface and the drain's exposed top;

thermal annealing the first metal layer to form a bottom silicide layer that includes:
a first bottom silicide layer section that overlies the source's lower top surface,
a second bottom silicide layer that extends horizontally from the first bottom silicide layer to penetrate the source's projection and to be located beneath the source's projection, and
a top silicide layer that overlies the drain's top;
substantially removing the spacer; and
removing the vertical spacer section while (i) the first bottom silicide layers remains over the source's lower top surface and (ii) the second bottom silicide layer remains beneath the source's projection and (iii) the top silicide layer remains over the drain's top.

17. The method of claim 16, wherein the top silicide layer is a first top silicide layer, and the method further comprising:
removing the first top silicide layer to expose the drain's top;
forming a semiconductor layer over the drain's exposed top;
forming a second metal layer over the semiconductor layer;
thermal annealing the semiconductor layer to form a second top silicide layer that overlies the drain's top; and
removing the second metal layer.

18. The method of claim 16, wherein the bottom silicide layers are formed with a thickness of about 10 to about 1000 angstrom.

19. The method of claim 16, wherein the top silicide layer is formed with a thickness of about 10 to about 1000 angstrom.

20. The method of claim 16, wherein the top silicide layer has a horizontal cross section area symmetrical to the second bottom silicide layer.

* * * * *